(12) United States Patent
Kawanishi et al.

(10) Patent No.: US 11,728,370 B2
(45) Date of Patent: Aug. 15, 2023

(54) IMAGE DISPLAY DEVICE

(71) Applicant: Sharp Fukuyama Laser Co., Ltd., Fukuyama (JP)

(72) Inventors: Hidenori Kawanishi, Hiroshima (JP); Koji Takahashi, Hiroshima (JP); Katsuji Iguchi, Hiroshima (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 108 days.

(21) Appl. No.: 17/189,659

(22) Filed: Mar. 2, 2021

(65) Prior Publication Data

US 2021/0288105 A1 Sep. 16, 2021

(30) Foreign Application Priority Data

Mar. 10, 2020 (JP) ................. 2020-041391

(51) Int. Cl.
| | |
|---|---|
| H01L 27/15 | (2006.01) |
| H01L 33/50 | (2010.01) |
| H01L 33/60 | (2010.01) |
| H01L 33/62 | (2010.01) |
| H01L 25/075 | (2006.01) |
| H01L 27/16 | (2006.01) |
| H01L 27/146 | (2006.01) |
| G09G 3/32 | (2016.01) |

(52) U.S. Cl.
CPC ............. *H01L 27/156* (2013.01); *G09G 3/32* (2013.01); *H01L 33/502* (2013.01); *H01L 33/60* (2013.01); *H01L 33/62* (2013.01)

(58) Field of Classification Search
CPC ......... H01L 25/0753; H01L 2933/0091; H01L 27/156; H01L 27/14627; H01L 33/60
See application file for complete search history.

(56) References Cited

U.S. PATENT DOCUMENTS

| | | | |
|---|---|---|---|
| 2011/0297975 A1 | 12/2011 | Yeh et al. | |
| 2017/0263828 A1* | 9/2017 | Mao | ............ H10K 59/121 |
| 2020/0235084 A1* | 7/2020 | Wu | ................ H01L 24/83 |

FOREIGN PATENT DOCUMENTS

| | | | | | |
|---|---|---|---|---|---|
| CN | 109256456 A | * | 1/2019 | ......... | H01L 25/0753 |
| CN | 112420897 A | * | 2/2021 | ......... | H01L 25/0753 |
| JP | 2002141492 A | | 5/2002 | | |
| WO | WO-2020153191 A1 | * | 7/2020 | ......... | H01L 25/0753 |

* cited by examiner

*Primary Examiner* — Antonio B Crite
(74) *Attorney, Agent, or Firm* — ScienBiziP, P.C.

(57) ABSTRACT

An image display device comprises a drive circuit substrate including a drive circuit that supplies currents to micro light-emitting elements to emit light; and the micro light-emitting elements arranged in an array shape on the drive circuit substrate, wherein a light-distribution control unit that increases forward light emission of the micro light-emitting elements is disposed on a light-emitting surface of each of the micro light-emitting elements, and a partition wall that does not transmit the light emitted by the micro light-emitting elements is disposed around the light-distribution control unit.

19 Claims, 20 Drawing Sheets

1:PIXEL REGION
5:PIXEL
60:EMBEDDING MATERIAL
70:LIGHT-DISTRIBUTION CONTROL UNIT
71:OPTICAL ELEMENT
80:PARTITION WALL
130:LIGHT-EMITTING SURFACE
200:IMAGE DISPLAY DEVICE

IMAGE DISPLAY DEVICE

BACKGROUND

1. Field

An aspect of the disclosure relates to an image display device that includes a micro light-emitting element.

2. Description of the Related Art

A display device in which a plurality of micro light-emitting elements constituting pixels are arranged on a substrate (backplane) has been proposed. For example, according to the technique disclosed in Japanese Unexamined Patent Application Publication No. 2002-141492, drive circuits are formed on a silicon substrate, and an array of minute light-emitting diodes (LEDs) that emit ultraviolet light is disposed on the drive circuits. The technique discloses a small-sized display device in which a wavelength conversion layer that converts ultraviolet light to visible light of red, green, and blue colors is provided on the light-emitting diode array to thereby display a color image.

Such a display device has characteristics of high luminance and high durability while being small. Therefore, the display device is expected to be a display device for glasses-like devices, head-up displays (HUDs), and the like.

In such a display device, it is desirable to improve light emission efficiency for improving power efficiency and to efficiently extract generated light to an optical system. Thus, as disclosed in U.S. Patent No. 2011/0297975, it is proposed that a photonic crystal structure is provided on a micro light-emitting element to improve light extraction efficiency and collimate emitted light.

However, according to the structure of the micro light-emitting element and the display device disclosed in Japanese Unexamined Patent Application Publication No. 2002-141492 described above, light is confined inside the micro light-emitting element, and a proportion of light emitted to the outside decreases, thus posing a problem of low light emission efficiency.

Such a decrease in light extraction efficiency is a phenomenon occurring because a refractive index of a light-emitting material constituting the micro light-emitting element is larger than refractive indices of air and a resin. The decrease in light emission efficiency causes problems such as an increase in power consumption and a rise in temperature due to heat generation.

Further, the micro light-emitting element exhibits light emission distribution close to Lambertian distribution, and light emission angle distribution thereof is wide. Therefore, display devices for small-sized glasses-like devices and mobile displays emit a large amount of wasteful light that is not used. This results in an increase in wasteful power consumption.

Thus, it is considered that an optical element such as a microbead or microlens is provided on a light-emitting surface of the micro light-emitting element to increase light emitted forward and improve light efficiency. As a result, it is possible to reduce power consumption. However, it is found that such an attempt increases light emitted to peripheral pixels and causes so-called optical crosstalk. Optical crosstalk causes a degradation in contrast of a display image. Additionally, optical crosstalk in a full-color display device causes color mixture and results in a problem of a degradation in color reproducibility.

An aspect of the present disclosure is made in view of the aforementioned problems and provides an image display device that achieves high contrast, high color reproducibility, and small power consumption by improving efficiency of light emission in the forward direction of a micro light-emitting element while suppressing optical crosstalk.

SUMMARY

To address the aforementioned problems, an image display device according to an aspect of the disclosure includes: a drive circuit substrate including a drive circuit that supplies currents to micro light-emitting elements to emit light; and the micro light-emitting elements arranged in an array shape on the drive circuit substrate, in which a light-distribution control unit that increases forward light emission of the micro light-emitting elements is disposed on a light-emitting surface of each of the micro light-emitting elements, and a partition wall that does not transmit the light emitted by the micro light-emitting elements is disposed around the light-distribution control unit.

An image display device according to an aspect of the disclosure includes: a drive circuit substrate including a drive circuit that supplies currents to micro light-emitting elements to emit light; and the micro light-emitting elements arranged in an array shape on the drive circuit substrate, in which a plurality of optical elements are arranged on a light-emitting surface of each of the micro light-emitting elements, and a partition wall that does not transmit the light emitted by the micro light-emitting elements is disposed around the plurality of optical elements.

DESCRIPTION OF THE EMBODIMENTS

Figure 1:
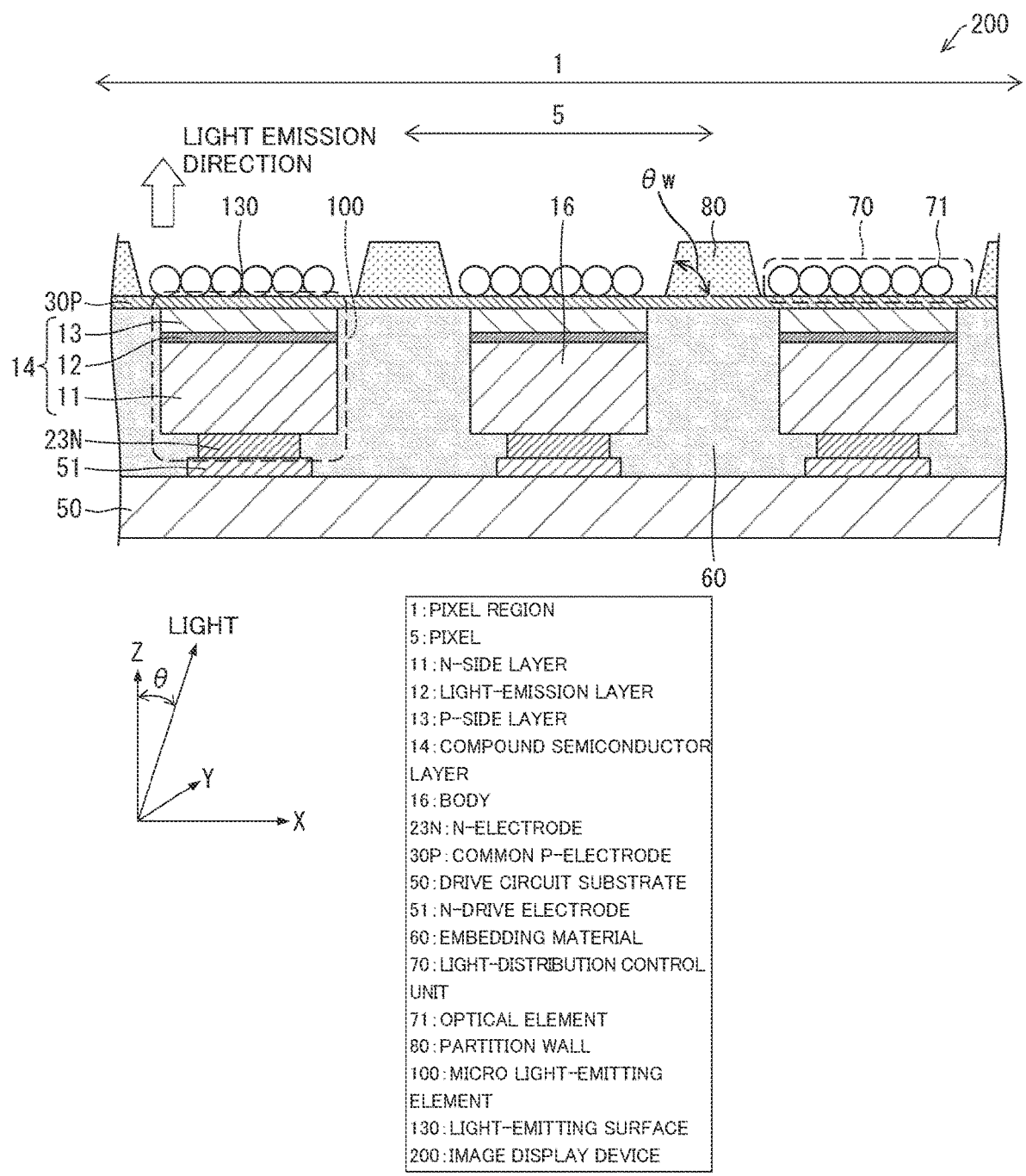
FIG. 1 is a schematic sectional view of a pixel region of an image display device according to Embodiment 1 of the disclosure.

Embodiments of the disclosure will be described below with reference to FIGS. 1 to 20 by taking an image display device including a plurality of micro light-emitting elements as an example. Note that the image display device includes the plurality of micro light-emitting elements and a drive circuit substrate, and the drive circuit substrate supplies currents to the micro light-emitting elements in a pixel region 1 to control light emission. The micro light-emitting elements are arranged in an array shape in the pixel region 1. The micro light-emitting elements emit light to a side of the micro light-emitting elements opposite to the drive circuit substrate.

Unless otherwise specified, the surface from which a micro light-emitting element emits light to the air is referred to as a light-emitting surface 130. Note that, in the description for the configuration of the image display device, unless otherwise specified, the light-emitting surface 130 is referred to as an upper surface (first surface) of the micro light-emitting element, a surface opposite to the light-emitting surface is referred to as a lower surface (second surface), and surfaces on sides other than the upper surface and the lower surface are referred to as side surfaces. A direction that is vertical to the light-emitting surface 130 and extends toward the air is referred to as forward. Also regarding another component, a surface on a light-emitting surface side is referred to as an upper surface of the component, and a surface opposite to the light-emitting surface is referred to as a lower surface of the component.

In the drive circuit substrate, a micro light-emitting element drive circuit that controls the current supplied to each of the micro light-emitting elements is disposed in the pixel region 1, and a row selection circuit that selects each row of the micro light-emitting elements that are disposed in a two-dimensional matrix, a column signal output circuit that outputs a light-emitting signal to each column, an image processing circuit that calculates a light-emitting signal on the basis of an input signal, an input/output circuit, and the like are arranged outside the pixel region 1.

A P-drive electrode (second drive electrode) and an N-drive electrode (first drive electrode) that are connected to the micro light-emitting element are disposed on a surface of the drive circuit substrate on a bonding surface side. The drive circuit substrate is generally a silicon substrate (semiconductor substrate) in which an LSI is formed or a glass substrate in which a TFT is formed. Since the drive circuit substrate is able to be manufactured by a well-known technique, detailed description for the function and the configuration thereof will not be given.

Note that, although the micro light-emitting element is illustrated in a shape close to a square in the drawing, the shape of the micro light-emitting element is not particularly limited. Although the micro light-emitting element may have various shape in plan views such as a rectangle, a polygon, a circle, and an ellipse, the longest dimension of the micro light-emitting element is assumed to be 60 µm or less. In the pixel region 1 of the image display device, 3000 or more micro light-emitting elements are assumed to be integrated.

Embodiment 1

(Configuration of Image Display Device 200)

Figure 2:
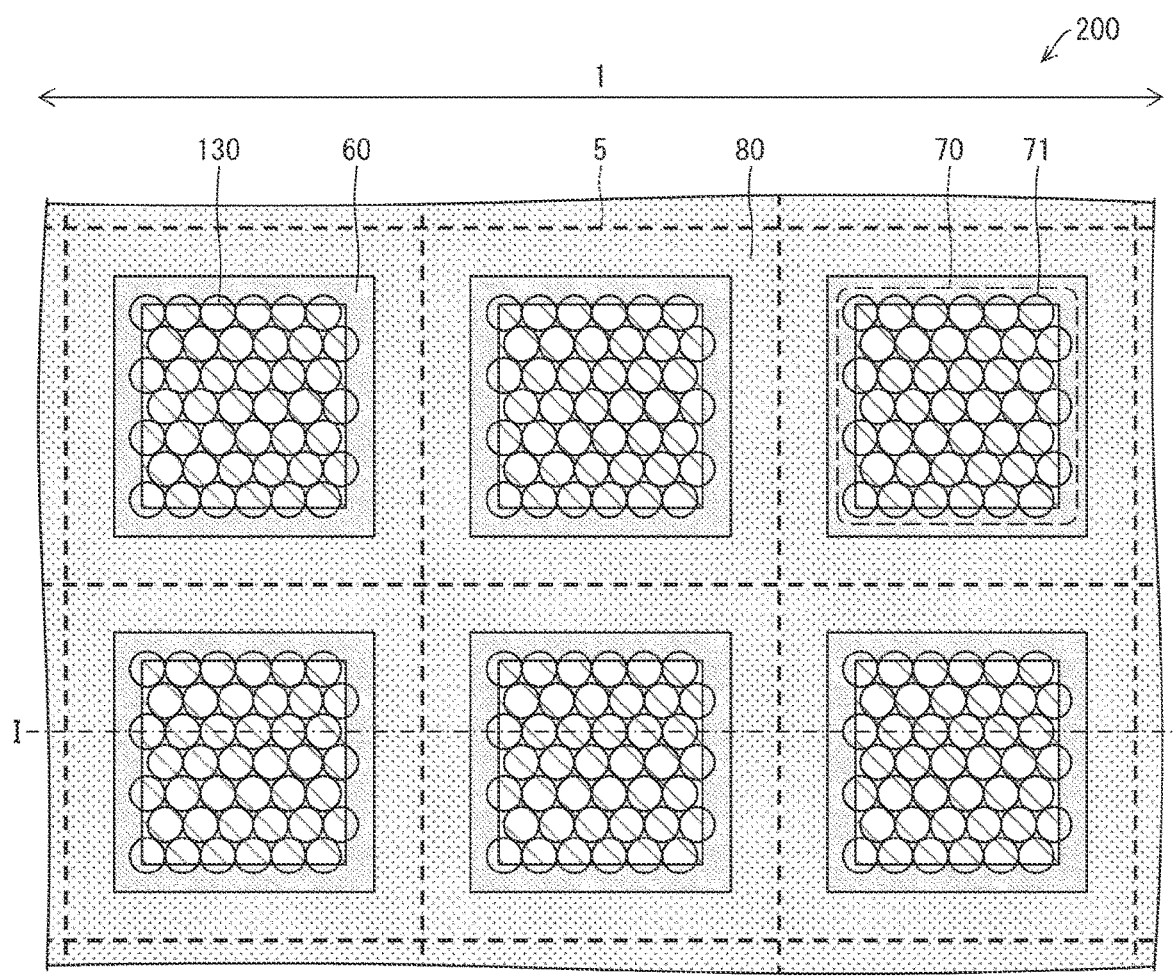
FIG. 2 is a schematic plan view of the pixel region of the image display device according to Embodiment 1 of the disclosure.

FIG. 1 is a schematic sectional view of the pixel region 1 of the image display device 200 according to Embodiment 1 of the disclosure. FIG. 2 is a schematic plan view of the pixel region 1 of the image display device 200 according to Embodiment 1 of the disclosure. As illustrated in FIG. 2, the upper surface of the image display device 200 is the pixel region 1 in which a plurality of pixels 5 are arranged in an array shape.

In the present embodiment, the image display device 200 is a monochromatic display device, and each of the pixels 5 includes one micro light-emitting element 100 which is monochromatic. In the present configuration, the upper surface of the micro light-emitting element 100 is the light-emitting surface 130, and a light-distribution control unit 70 is formed on the light-emitting surface 130. The light-distribution control unit 70 is used to increase forward emission of the micro light-emitting element 100. The light-distribution control unit 70 is formed by one or more optical elements 71 being densely arranged. That is, the light-distribution control unit 70 has one or more optical elements 71 being arranged. In the present embodiment, the optical element 71 is a microbead that is formed from a transparent resin with a refractive index of 1.7 and that has a spherical shape. The light-distribution control unit 70 desirably covers the light-emitting surface 130 of the micro light-emitting element 100. A partition wall 80 is disposed outside the light-distribution control unit 70. Note that, unless otherwise specified, description will be given with a coordinate system in which the horizontal direction on the paper in FIG. 1 is defined as the X-axis, the depth direction on the paper is defined as the Y-axis, and the upper direction is defined as the Z-axis. That is, the Z-axis positive direction is forward.

The partition wall 80 is disposed between adjacent pixels 5. The partition wall 80 separates light-distribution control units 70 that belong to the respective pixels. The partition wall 80 does not transmit light emitted by the micro light-emitting element 100. That is, transmittance of the partition wall 80 with respect to the light emitted by the micro light-emitting element 100 is at least 50% or less, desirably 10% or less. A side surface of the partition wall 80 may have either a reflective property or an absorptive property to suppress optical crosstalk. Further, the side surface of the partition wall 80 desirably has a reflective property to further enhance light extraction efficiency. The side surface of the partition wall 80 having a reflective property means that reflectance of the side surface of the partition wall 80 with respect to the light that is emitted is at least 50% or more, desirably 80% or more. In the present configuration, the partition wall 80 is formed of a metal material. The side surface is formed of a metal material having high reflectance to visible light, and examples thereof include silver and aluminum. Moreover, the side surface is inclined so as to open in a light emission direction. That is, the side surface of the partition wall 80 is inclined in a forward taper. An angle θw of inclination is desirably smaller than 90 degrees, more desirably in a range of about 45 degrees to 80 degrees. The height of the partition wall 80 is desirably higher than or equal to the height of the light-distribution control unit 70. The partition wall 80 is disposed on an embedding material 60 and desirably does not cover the light-emitting surface 130.

The micro light-emitting element 100 includes a body 16 formed by a compound semiconductor layer 14, a common P-electrode 30P (second electrode), and an N-electrode 23N (first electrode). The compound semiconductor layer 14 includes a light-emission layer 12 that emits light, an N-side layer 11 (first conductive layer) that injects electrons to the light-emission layer 12, and a P-side layer 13 (second conductive layer) that injects holes to the light-emission layer 12. For example, when the micro light-emitting element emits light in a wavelength band from ultraviolet light to a red color, the compound semiconductor layer 14 is a nitride semiconductor (AlInGaN-based). When the micro light-emitting element emits light in a wavelength band from a yellowish green color to a red color, the compound semiconductor layer 14 is an AlInGaP-based semiconductor. When the micro light-emitting element emits light in a wavelength band from a red color to infrared, the compound semiconductor layer 14 is an AlGaAs- or GaAs-based semiconductor.

Although the compound semiconductor layer 14 forming the body 16 of the micro light-emitting element 100 will be described below with reference to only the configuration in which the P-side layer 13 is disposed on the light-emitting side, the configuration in which the N-side layer 11 is disposed on the light-emitting side may be adopted. Each of the N-side layer 11, the light-emission layer 12, and the P-side layer 13 is normally optimized by including a plurality of layers instead of a single layer. However, since this is not directly related to the configuration of the disclosure, the detailed structure of each of the layers will not be described. Although the light-emission layer is normally interposed between an N-type layer and a P-type layer, the N-type layer and the P-type layer may include a non-doped layer or may include a layer having dopants of opposite conductivity in some cases, and thus the N-type layer and the P-type layer will be described below as an N-side layer and a P-side layer, respectively.

FIG. 1 is a sectional view along line I-I in FIG. 2. As illustrated in FIGS. 1 and 2, the micro light-emitting elements 100 are arranged in a two-dimensional array shape on the drive circuit substrate 50. Each of the micro light-emitting elements 100 has the N-electrode 23N formed on the second surface and the common P-electrode 30P formed on the first surface. The N-electrode 23N is connected to the N-drive electrode 51 on the drive circuit substrate 50. The common P-electrode 30P is connected to the P-drive electrode 52 on the drive circuit substrate 50. The P-drive electrode 52 and the common P-electrode 30P are normally connected outside the pixel region 1 and are thus not illustrated in FIG. 1. The common P-electrode 30P is a transparent electrode and transmits the light emitted by the micro light-emitting element 100. In the present configuration, a surface of the common P-electrode 30, which is opposite to a surface of the common P-electrode 30 in contact with the P-side layer 13, is the light-emitting surface 130. An electrode material, a protection film, and a reflective film that constitute the micro light-emitting element 100, and disposition thereof are not directly related to the disclosure, and a well-known technique is applicable thereto, and thus detailed description thereof will not be given and illustration thereof may be omitted in the drawing. Note that, since the partition wall 80 is formed on the common P-electrode 30P in the present configuration, the partition wall 80 may be a portion of the common P-electrode 30P.

The current supplied from the drive circuit substrate 50 to the micro light-emitting element 100 is transmitted from the P-drive electrode 52 to the P-side layer 13 via the common P-electrode 30P. The current that has passed from the P-side layer 13 to the light-emission layer 12 flows from the N-side layer 11 to the N-drive electrode 51 via the N-electrode 23N. In this manner, the micro light-emitting element 100 emits light with given intensity in accordance with the amount of the current supplied from the drive circuit substrate 50.

The micro light-emitting elements 100 are separately divided and are covered with the embedding material 60. It is desirable that the height of the light-emitting surface 130 is substantially equal to the height of the embedding material 60. The embedding material 60 desirably has a function of shielding light by reflection or absorption to suppress leakage of light to an adjacent pixel. When being transparent, the embedding material 60 does not have the light-shielding function, and thus a side wall of the micro light-emitting element is desirably covered with a metal film.

In the present configuration, microbeads serving as the optical elements 71 are densely disposed on the light-emitting surface 130. In the present embodiment, an average diameter of the microbeads is 500 nm, a distance between adjacent microbeads is substantially equal to the average diameter, and the microbeads are in contact with each other. Although the microbeads are disposed with regularity at the vertex of an equilateral triangle in plan view in FIG. 2, the microbeads may be disposed with no regularity as long as being densely disposed. Moreover, the microbeads are each illustrated in a spherical shape in FIG. 1 but may be elliptical. Such a microbead is able to be formed by a method of applying a slurry dispersed into water or an organic solvent, a rapid convective deposition method, or the like. Since the dimension of the microbead has a variation of about ±20%, the dimension is defined by an average value.

As illustrated in FIG. 1, the micro light-emitting elements 100 emitting blue light were arranged in an array shape at a pitch of 8 μm, and microbeads were formed thereon with an adjacent distance of 0.5 μm. Each of the microbeads had a height of 0.5 μm and a refractive index of 1.7. The amounts of blue light emitted from the micro light-emitting elements 100 were compared before and after the microbeads were formed. 10000 micro light-emitting elements 100 were simultaneously lit, and the intensities of all beams of light were measured. By forming the microbeads, the light emission intensity increased 1.5 times. It is considered that the microbeads enable light extraction efficiency to be improved. Further, as a result of measuring emission angle distribution to compare intensities of forward emission, by forming the microbeads, the amount of light emitted at θ≤30 degrees increased about twice. Accordingly, it was confirmed that the microbeads exerted the effect of increasing forward emission. Here, unless otherwise specified, the forward emission refers to mainly emission in the forward direction and, in a broadest sense, emission at θ≤45 degrees.

Further, to evaluate image quality, a single pixel was lit, an image of a display surface was captured by a camera, and the light amounts of the lit pixel and a pixel adjacent thereto were compared, thereby evaluating contrast. Although luminance of the single pixel increased, the light amount of about 1/100 of the light amount of the lit pixel was observed also from the adjacent unlit pixel. It is considered that the microbeads cause leakage of light to peripheral pixels and a degradation in contrast.

To suppress optical crosstalk as described above, the structure in which the partition wall 80 was disposed between pixels was made. A microbead between pixels was etched by a dry etching method and removed, and an aluminum film of 0.6 μm in thickness was deposited thereon by a lift-off method. A side wall of the aluminum film was inclined at 80 degrees on average. Compared with the structure including no partition wall 80, in the structure including the partition wall 80, the intensities of all beams of light were substantially equal to each other, and the intensity of light emitted forward at θ≤30 degrees increased about 1.2 times, and the light emission intensity of the adjacent pixel was reduced to a level that was not able to be observed. It was found that the partition wall 80 increased forward emission and reduced optical crosstalk.

Emission angle distribution of light emitted from the respective pixels was simulated to verity the effect of the partition wall 80 in the present configuration. Distribution when no partition wall 80 was provided and distribution when neither the light-distribution control unit 70 nor the partition wall 80 was provided were also simulated for comparison. As illustrated in FIG. 1, the light emission angle θ is an angle formed by the light emission direction and the Z-axis. Light emission intensity distribution integrated over the azimuthal direction is indicated. The compound semiconductor layer 14 was an AlGaIn-based semiconductor (nitride semiconductor) and had a light emission peak wavelength of 450 nm. The body 16 was formed into a square having one side of 2 μm in a shape in plan view and having a thickness of 2 μm and had the P-side layer 13 of 200 nm in thickness. The simulation was performed by assuming that the periphery of the body 16 was covered with aluminum.

The optical elements 71 were each a sphere of 500 nm in diameter. The optical elements 71 were disposed at the vertex of an equilateral triangle having one side of 500 nm in plan view. The height of the partition wall 80 was defined as 500 nm, and the inclination angle θw of the side surface was defined as 70 degrees. A FDTD (finite-difference time-domain) method was used for the simulation. The grid size was 25 nm, the simulation region had 6 μm in the X-axis direction, 6 μm in the Y-axis direction, and 7 μm in the Z-axis direction, and a perfect matched layer with thickness of 1 μm was disposed outside the simulation region. When the light-emitting surface 130 was disposed at Z=0, calculation was performed for a near filed in a region of Z>0, and emission angle distribution in a far field was calculated on the basis of the calculation result for the near field.

Figure 3:
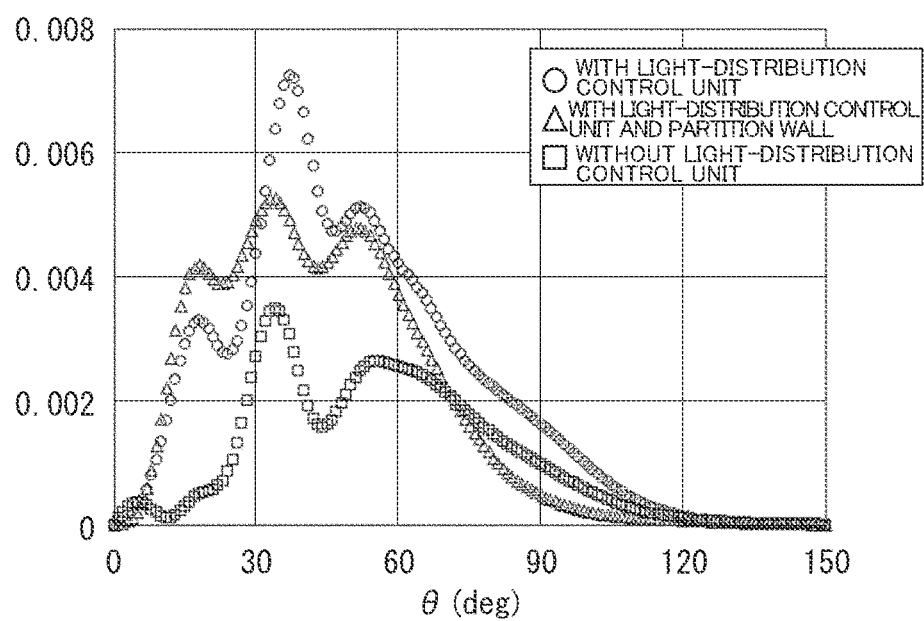
FIG. 3 illustrates the results of simulation of light emission angle distribution according to Embodiment 1 of the disclosure.

FIG. 3 illustrates light emission angle distribution when the refractive index of the optical element 71 is 2.0. Table 1 described below indicates the results of simulation of light extraction efficiency at θ≤20 degrees, θ≤30 degrees, θ≤40 degrees, θ≤90 degrees, and 90 degrees<θ≤180 degrees while the refractive index of the optical element 71 changes, when only the light-distribution control unit 70 is provided.

TABLE 1

| Refractive index | 2.4 | 2 | 1.7 | 1.43 | 1 |
|---|---|---|---|---|---|
| θ ≤ 20 deg | 3.1% | 3.3% | 2.1% | 0.8% | 0.6% |
| θ ≤ 30 deg | 6.9% | 6.5% | 4.5% | 2.6% | 2.0% |
| θ ≤ 40 deg | 10.3% | 12.9% | 9.5% | 5.2% | 5.0% |
| θ ≤ 90 deg | 24.3% | 30.9% | 26.8% | 18.6% | 14.7% |
| 90 < θ ≤ 180 deg | 2.4% | 1.4% | 1.5% | 1.9% | 1.4% |

Table 2 described below indicates the results when the light-distribution control unit 70 and the partition wall 80 are provided.

TABLE 2

| Refractive index | 2.4 | 2 | 1.7 | 1.43 |
|---|---|---|---|---|
| θ ≤ 20 deg | 4.4% | 4.1% | 3.3% | 1.1% |
| θ ≤ 30 deg | 7.6% | 8.4% | 7.0% | 2.5% |
| θ ≤ 40 deg | 12.1% | 13.3% | 13.1% | 4.9% |
| θ ≤ 90 deg | 21.8% | 27.2% | 27.7% | 14.7% |
| 90 < θ ≤ 180 deg | 0.4% | 0.7% | 0.7% | 0.5% |

By providing the light-distribution control unit 70, light emission at θ≤90 degrees increases, and light extraction efficiency is greatly improved. In particular, light emission at θ≤30 degrees remarkably increases. As can be seen from Table 1, the increase in refractive index of the optical element 71 results in improvement of light extraction efficiency. When the body 16 is a nitride semiconductor, the refractive index of the optical element 71 is desirably 1.7 or more, more desirably 2 or more. Here, since the refractive index of 1.7 is close to a geometric mean (multiply mean) of the refractive index of 2.47 of the nitride semiconductor and the refractive index of the air (outside medium), a lower limit of the desired refractive index of the optical element 71 is desirably a geometric mean of the refractive index of a material forming a part that generates light and the refractive index of the outside medium.

By providing the light-distribution control unit 70, light extraction efficiency is improved, and forward emission increases, whereas emission at 90 degrees<θ≤180 degrees increases. This indicates that providing the light-distribution control unit 70 results in an increase in light emitted at a position (in the Z-axis positive direction) higher than the light-emitting surface 130 and results in an increase in light travelling in the Z-axis negative direction. Such light enters an adjacent pixel, and after the light is reflected by the adjacent pixel, the light acts as if the light was emitted from the adjacent pixel, and thus optical crosstalk is caused. The light emitted at 90 degrees<θ≤180 degrees has intensity, which is more than or equal to a half of the intensity of the light emitted at θ≤20 degrees, and is unignorable.

A side surface of the microbead is a circular curved surface, and in a state where the microbead is disposed on the light-emitting surface 130, an upper portion of the curved surface is inclined relative to the light-emitting surface 130 such that an inclination angle continuously changes. The increase in emission at 90 degrees<θ≤180 degrees is caused by an increase of light refracted to backward side (light-emitting surface 130 side) by the inclined surface of the optical element 71 which intends to increase light refracted forward. Accordingly, when the optical element 71 that has the surface inclined relative to the light-emitting surface 130, is transparent, and has refractivity is provided, light emission in the forward direction increases, but such light causing optical crosstalk inevitably increases.

On the other hand, as illustrated in FIG. 3, by providing the partition wall 80 in addition to the light-distribution control unit 70, the amount of light emitted at 90 degrees<θ≤180 degrees is able to be greatly reduced. As indicated in Table 2, regardless of the refractive index of the optical element 71, the light amount is able to be reduced to be less than or equal to the light amount that is obtained when no light-distribution control unit 70 is provided. As can be seen from comparison of Tables 1 and 2, the partition wall 80 causes a reduction in the amount of light at θ≤90 degrees but is able to increase the amount of light at θ≤20 degrees, θ≤30 degrees, and θ≤40 degrees. That is, while light extraction efficiency is reduced, there is also an advantage of an increase in forward emission, which is more desirable. Note that, in the present embodiment, the optical element 71 constituting the light-distribution control unit 70 refracts light to thereby increase light emission in the forward direction but is able to achieve a similar function by diffracting light. When the optical element 71 diffracts light while keeping a certain height, similarly to the present embodiment, some of light is emitted to the light-emitting surface 130 to cause optical crosstalk. Thus, also when the optical element 71 controls a traveling direction of light by the diffracting effect, the effect of the partition wall 80 suppressing optical crosstalk is effective.

Note that, as a result of comparison when the light emission angle is θ≤5 degrees in FIG. 3, it is found that, when the light-distribution control unit 70 is provided, a light output in the case of θ≤5 degrees is reduced. This indicates that, when no light-distribution control unit 70 is provided, a certain amount of light travels forward from the light-emission layer 12. Such light is refracted by the light-distribution control unit 70 to change the direction. Therefore, when the light-distribution control unit 70 is provided, such light is considered to be reduced. That is, it is indicated that, when the light-distribution control unit 70 is provided, some light to be emitted forward is lost, but much more light is refracted forward by the light-distribution control unit 70, thus making it possible to greatly increase forward emission.

Table 3 described below indicates the results of simulation when the height h of the partition wall 80 changes from 0.25 μm to 1 μm.

TABLE 3

|  | h = 0 | h = 0.25 | h = 0.5 | h = 0.75 | h = 1 |
| --- | --- | --- | --- | --- | --- |
| θ ≤ 20 deg | 3.3% | 3.9% | 4.1% | 5.0% | 5.4% |
| θ ≤ 30 deg | 6.5% | 7.2% | 8.4% | 9.5% | 10.6% |
| θ ≤ 40 deg | 12.9% | 12.3% | 13.3% | 14.5% | 15.8% |
| θ ≤ 90 deg | 30.9% | 27.6% | 27.2% | 27.1% | 27.1% |
| 90 < θ ≤ 180 deg | 2.3% | 1.6% | 0.7% | 0.5% | 0.4% |

The angle of a side wall of the partition wall 80 is 70 degrees. No partition wall 80 is provided when h=0. Even in the case of h=0.25 μm, the effect of reducing emission at 90 degrees<θ≤180 degrees and increasing forward emission is exerted. By increasing the height of the partition wall 80, it is possible to further reduce emission at 90 degrees<θ≤180 degrees and increase forward emission. The effect is remarkable particularly when the height of the partition wall 80 is higher than or equal to the height (0.5 μm) of the optical element 71.

Table 4 described below indicates the results of simulation when the inclination angle θw of the side wall of the partition wall 80 changes from 90 degrees to 50 degrees.

TABLE 4

|  | θw = 90 | θw = 80 | θw = 70 | θw = 60 | θw = 50 |
| --- | --- | --- | --- | --- | --- |
| θ ≤ 20 deg | 3.6% | 3.9% | 4.1% | 3.8% | 3.8% |
| θ ≤ 30 deg | 7.1% | 8.4% | 8.4% | 8.1% | 7.7% |
| θ ≤ 40 deg | 11.7% | 13.2% | 13.3% | 14.5% | 14.2% |
| θ ≤ 90 deg | 25.6% | 26.9% | 27.2% | 29.6% | 29.6% |
| 90 < θ ≤ 180 deg | 1.0% | 0.8% | 0.8% | 0.6% | 0.7% |

Even in the case of θw=90 degrees, the effect of reducing emission at 90 degrees<θ≤180 degrees is exerted. θw is desirably in a range of 70 degrees to 60 degrees to exert a remarkable effect of reducing emission at 90 degrees<θ≤180 degrees and increasing forward emission.

As described above, by disposing the light-distribution control unit 70 on the light-emitting surface 130 of the micro light-emitting element 100, it is possible to greatly improve a light output and increase light emission in the forward direction. Further, by providing the partition wall 80, it is possible to suppress optical crosstalk between pixels and further improve a light output in the forward direction.

MODIFIED EXAMPLES

The light-distribution control unit 70 of Embodiment 1 of the disclosure is able to have various forms. Such modified examples will be described below with reference to FIGS. 4 to 10. The modified examples are different from Embodiment 1 in configurations of the light-distribution control unit 70 and the partition wall 80 but are the same with Embodiment 1 in the other portions.

Figure 4:
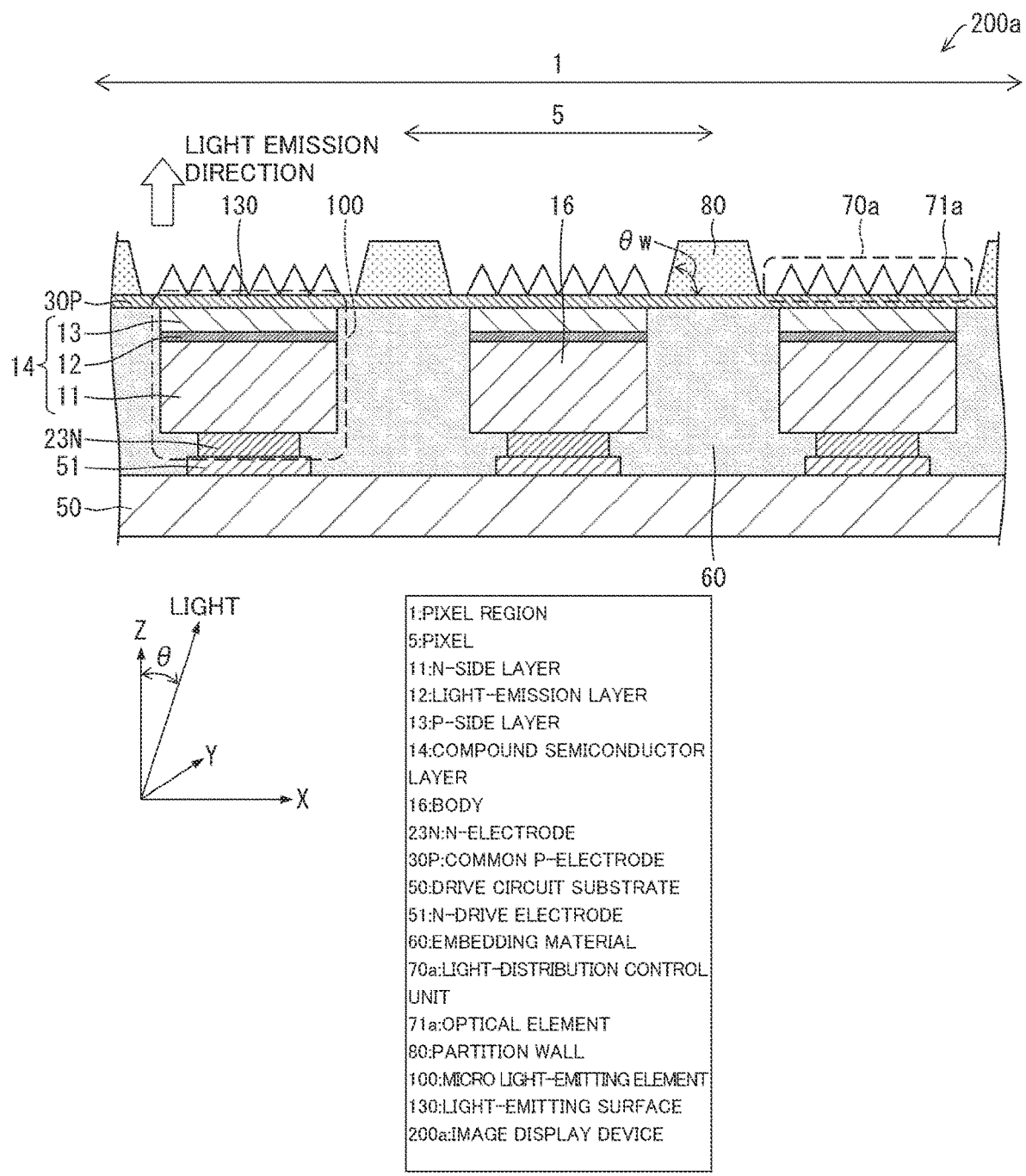
FIG. 4 is a schematic sectional view of a pixel region of an image display device according to a modified example of Embodiment 1 of the disclosure.

Although the optical element 71 constituting the light-distribution control unit 70 is a transparent sphere in Embodiment 1, an optical element 71a constituting a light-distribution control unit 70a of an image display device 200a illustrated in FIG. 4 is a micro cone formed by a transparent body of a triangular pyramid shape. Although the optical element 71a is illustrated as a completely triangular pyramid in FIG. 4, the optical element 71a may be a truncated triangular pyramid whose upper surface is a flat surface. The micro cone or the truncated triangular pyramid has a side surface inclined relative to the light-emitting surface 130, and in a state where the optical element 71a is disposed on the light-emitting surface 130, the side surface is inclined relative to the light-emitting surface 130. The shape of the optical element 71a in plan view is not limited to a circle and may be an ellipse. Such shapes are able to be easily formed by molding a resin on the light-emitting surface 130 by a nanoimprint method.

Figure 5:
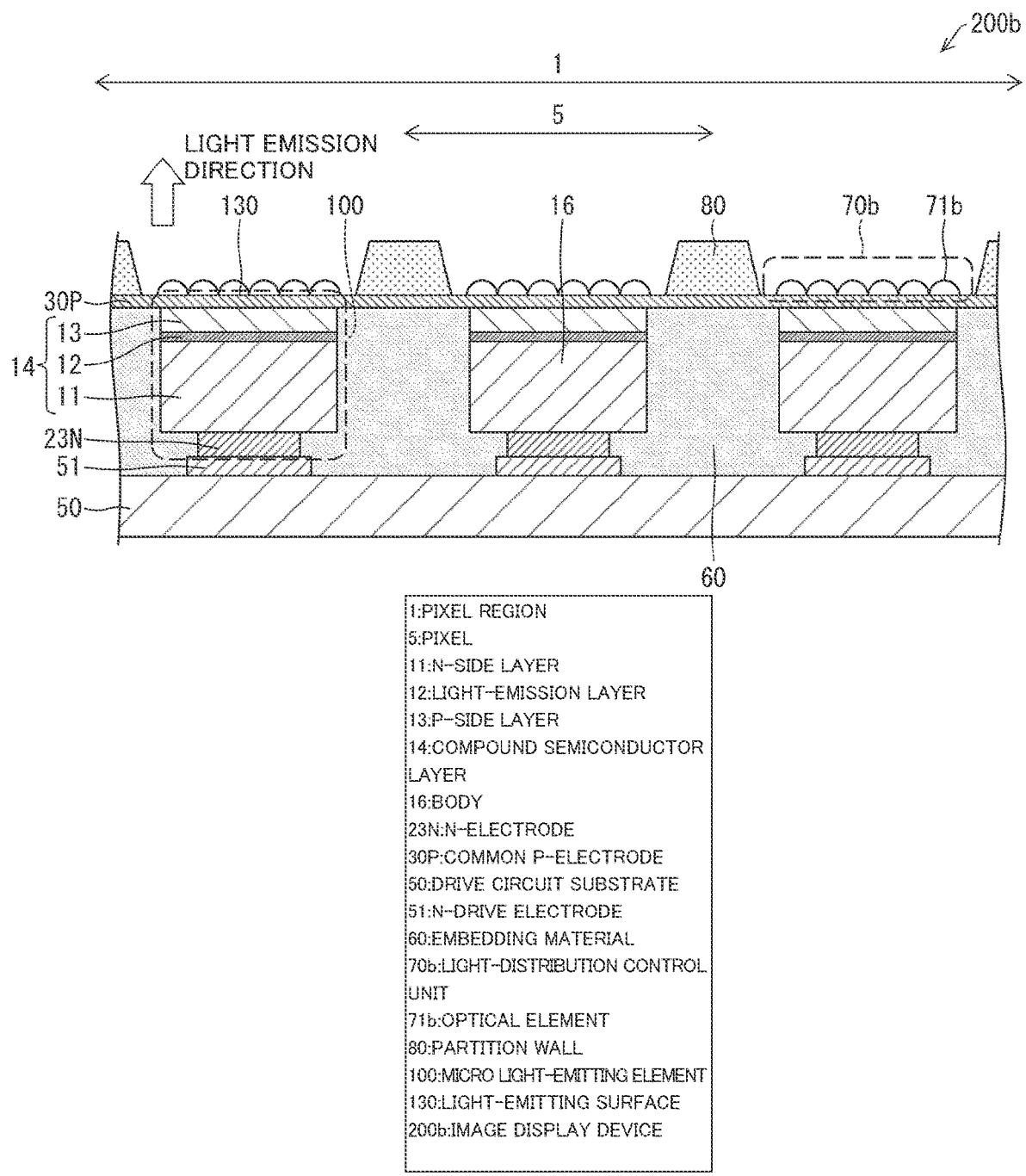
FIG. 5 is a schematic sectional view of a pixel region of an image display device according to a modified example of Embodiment 1 of the disclosure.

In an image display device 200b illustrated in FIG. 5, an optical element 71b constituting a light-distribution control unit 70b is a micro dome that is a transparent body of a hemispherical shape. The shape of the micro dome is not limited to a hemisphere and may be any shape in plan view or any shape in sectional view as long as being formed into a dome. A side surface of the micro dome is a curved surface, and in a state where the optical element 71b is disposed on the light-emitting surface 130, the curved surface is inclined relative to the light-emitting surface 130 such that an inclination angle continuously changes.

Figure 6:
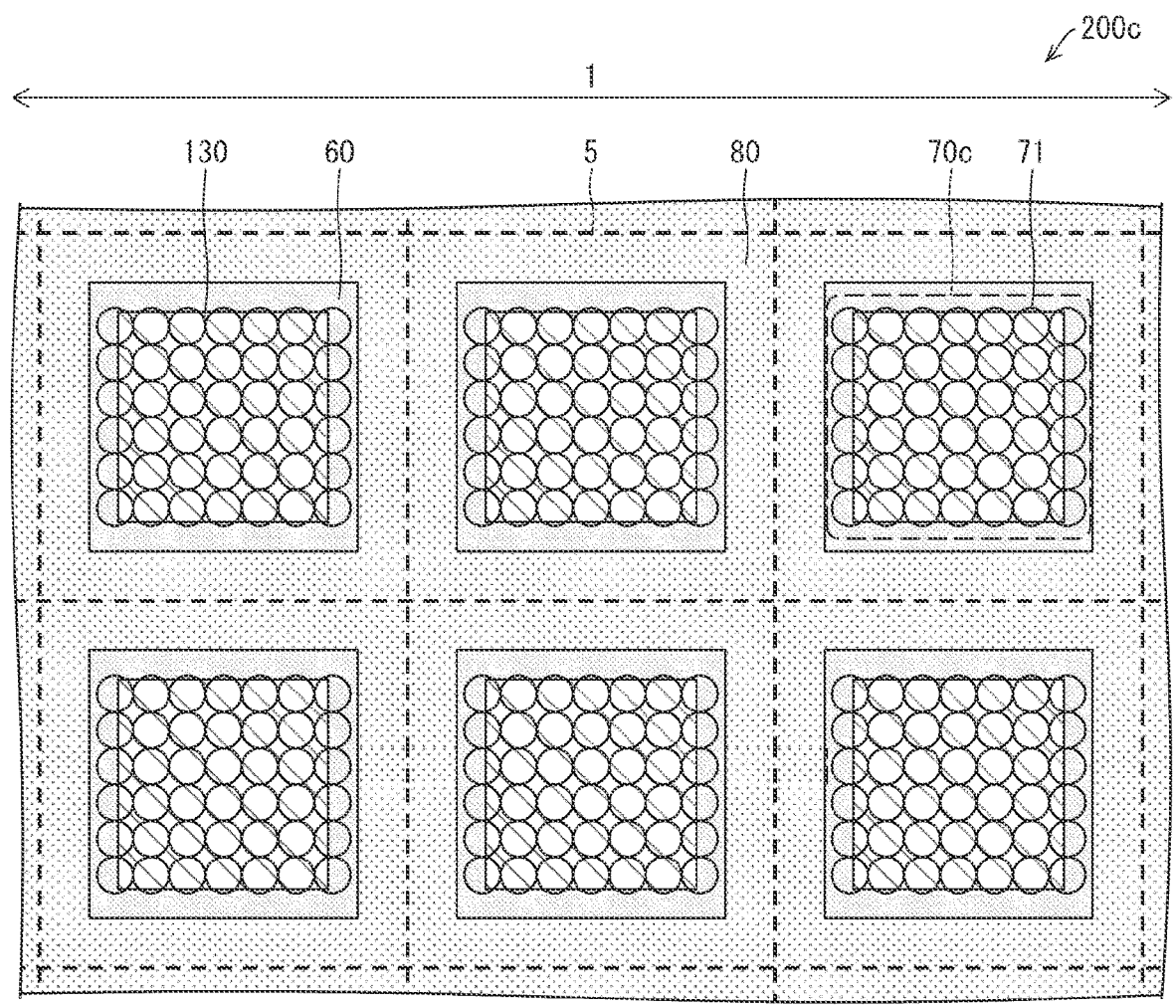
FIG. 6 is a schematic plan view of a pixel region of an image display device according to a modified example of Embodiment 1 of the disclosure.

Optical elements constituting a light-distribution control unit 70c in an image display device 200c illustrated in FIG. 6 are microbeads that are the same as those of Embodiment 1 except for a disposition pattern. The light-distribution control unit 70c adopts a disposition pattern in which optical elements 71 are arranged in a quadrangular shape. In this manner, there may be various variations of the disposition pattern.

Figure 7:
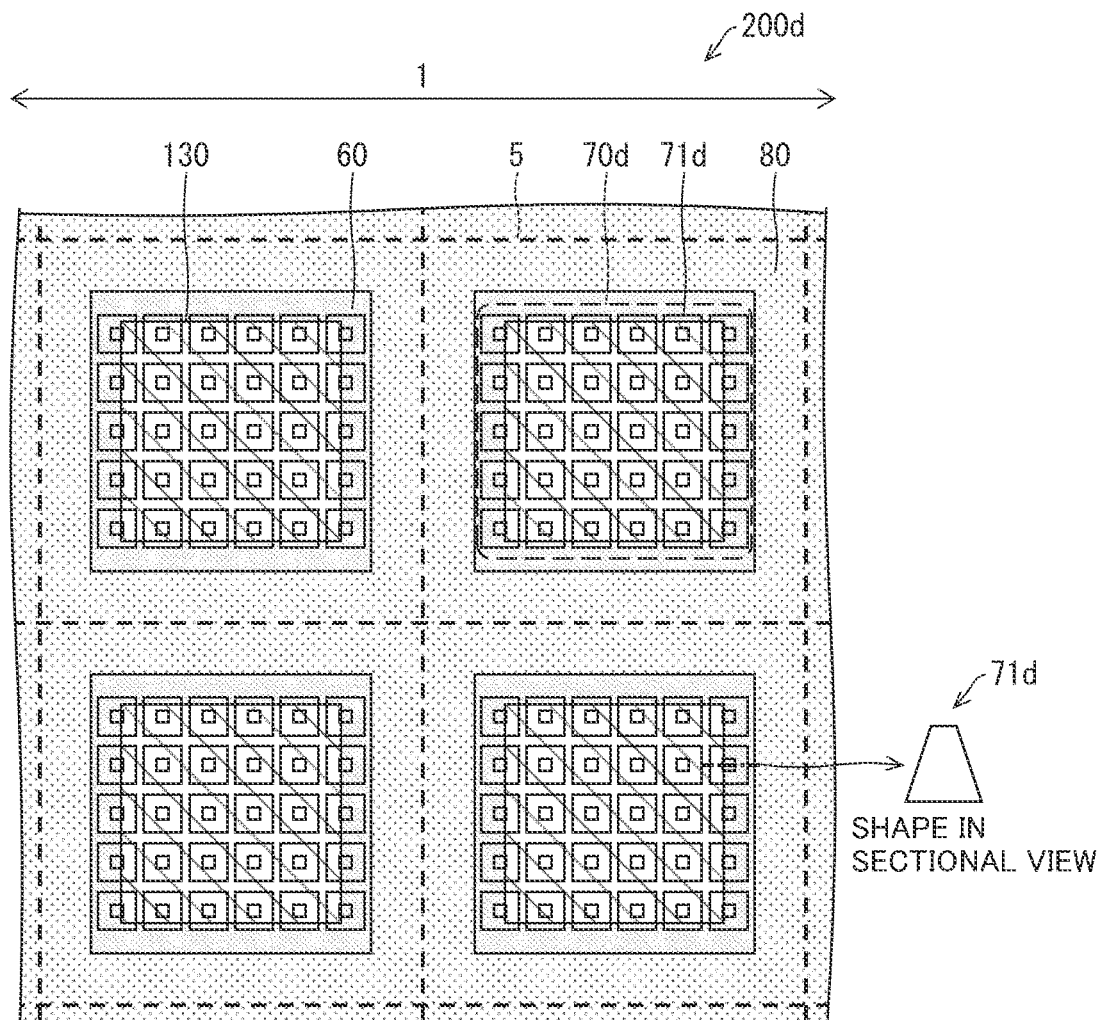
FIG. 7 is a schematic plan view of a pixel region of an image display device according to a modified example of Embodiment 1 of the disclosure.

In an image display device 200d illustrated in FIG. 7, an optical element 71d constituting a light-distribution control unit 70d is a transparent body of a truncated quadrangular pyramid shape. The shape may be a quadrangular pyramid shape obtained by forming a converged point from the upper surface of the truncated pyramid. The shape is not limited to a quadrangular pyramid and may be a triangular pyramid or a truncated triangular pyramid or may be a polygonal pyramid or a truncated polygonal pyramid which has a larger number of corners. A side surface of the polygonal pyramid or the truncated polygonal pyramid is inclined, and in a state where the optical element 71d is disposed on the light-emitting surface 130, the side surface is inclined relative to the light-emitting surface 130.

Figure 8:
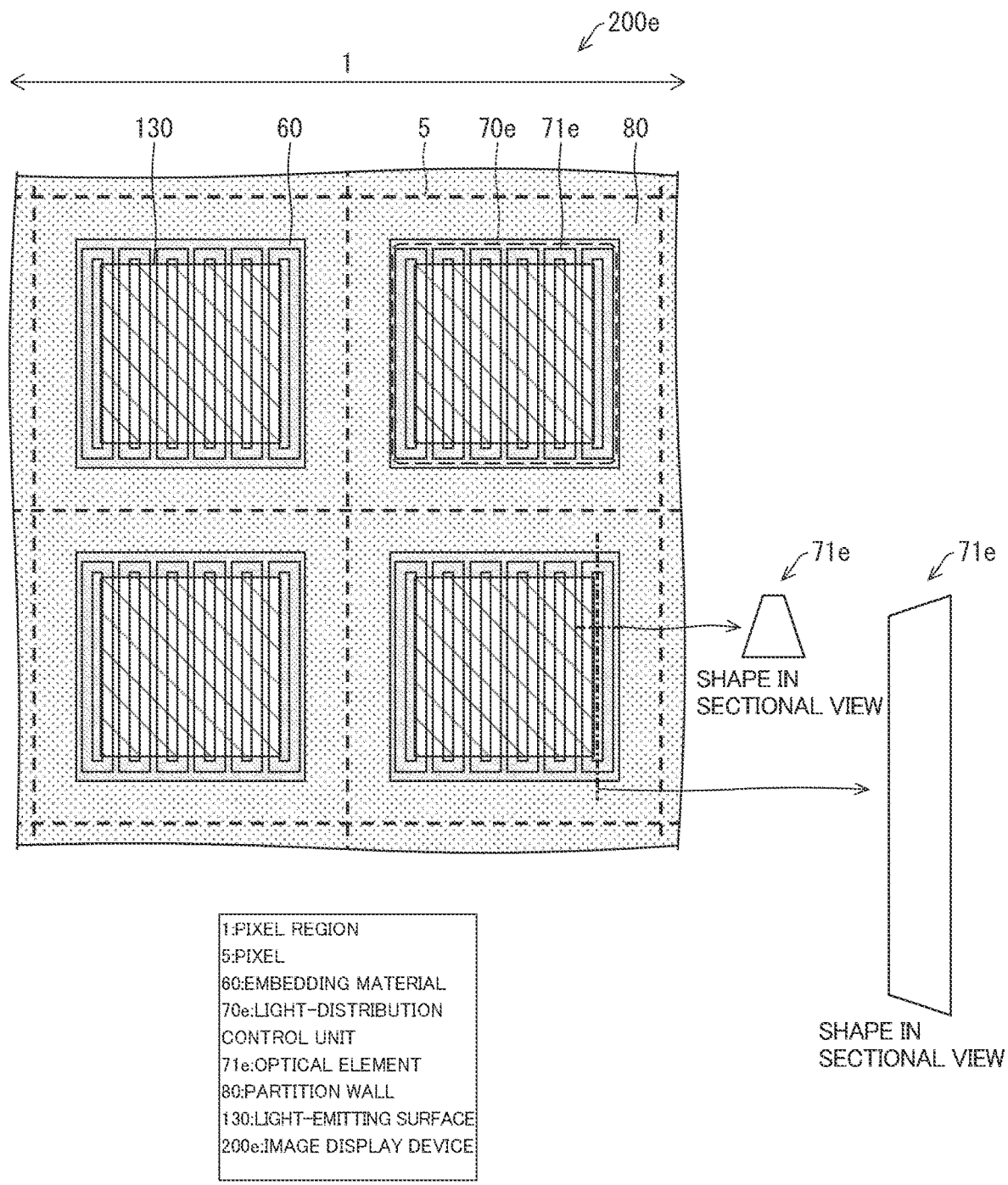
FIG. 8 is a schematic plan view of a pixel region of an image display device according to a modified example of Embodiment 1 of the disclosure.

In an image display device 200e illustrated in FIG. 8, an optical element 71e constituting a light-distribution control unit 70e is a micro rod that is an elongated and thin bar-shaped transparent body whose sectional surface is trapezoidal. The shape in sectional view may be a triangle. It is desirable that a surface that is an end of the bar is also inclined as illustrated in the drawing. A side surface of the micro rod is inclined, and in a state where the optical element 71e is disposed on the light-emitting surface 130, the side surface is inclined relative to the light-emitting surface 130.

The aforementioned shapes, except for the case of FIG. 6, are able to be formed by processing a transparent resin by using a nanoimprint lithographic method or the like. Light-distribution control units described above may be formed being precisely aligned on the light-emitting surface 130, and the partition wall 80 may be then formed. Alternatively, after optical elements are formed also on the embedding material 60 without being aligned, an optical element in a region in which the partition wall 80 is to be formed may be removed to form the partition wall 80.

Figure 9:
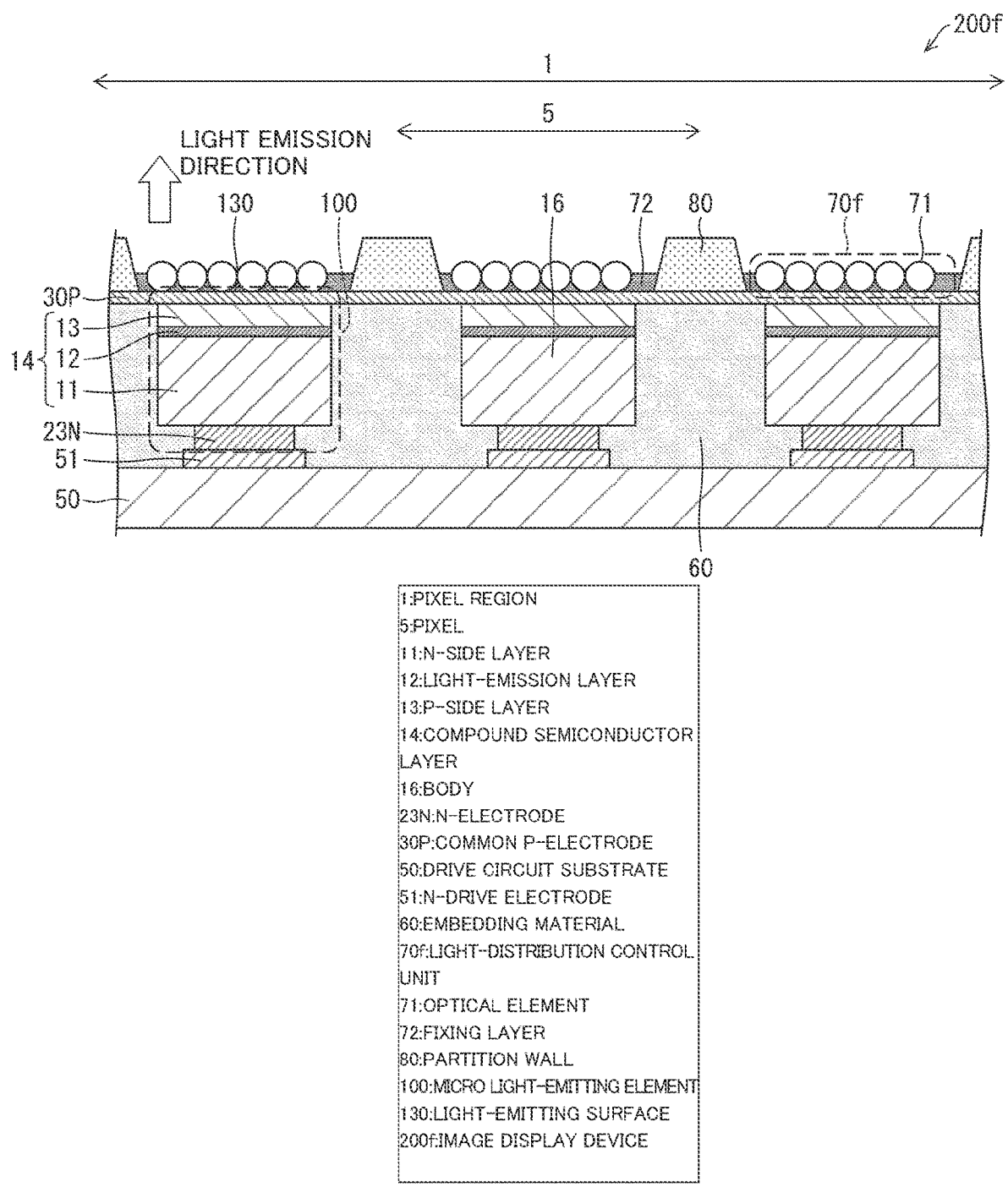
FIG. 9 is a schematic sectional view of a pixel region of an image display device according to a modified example of Embodiment 1 of the disclosure.

In an image display device 200f illustrated in FIG. 9, a fixing layer 72 for enhancing adhesiveness between the optical element 71 constituting a light-distribution control unit 70f and the light-emitting surface 130 is disposed between the optical element 71 and the light-emitting surface 130. The fixing layer 72 is formed of a material that is transparent to light that is emitted. For example, the fixing layer 72 is formed of a transparent resin material and is applied to the light-emitting surface 130 to function as an adhesive to the optical element 71 that is disposed after that. Alternatively, the fixing layer 72 is a remaining film that remains on the light-emitting surface 130 when the optical element 71 is formed on the light-emitting surface 130 by a nanoimprint method. The remaining film is made from the same material as the optical element 71 and is transparent to light that is emitted. Alternatively, the fixing layer 72 may be an inorganic film, such as a $SiO_2$ film or a SiN film, or a resin film which is deposited as a protection film after the optical element 71 is disposed on the light-emitting surface 130.

Figure 10:
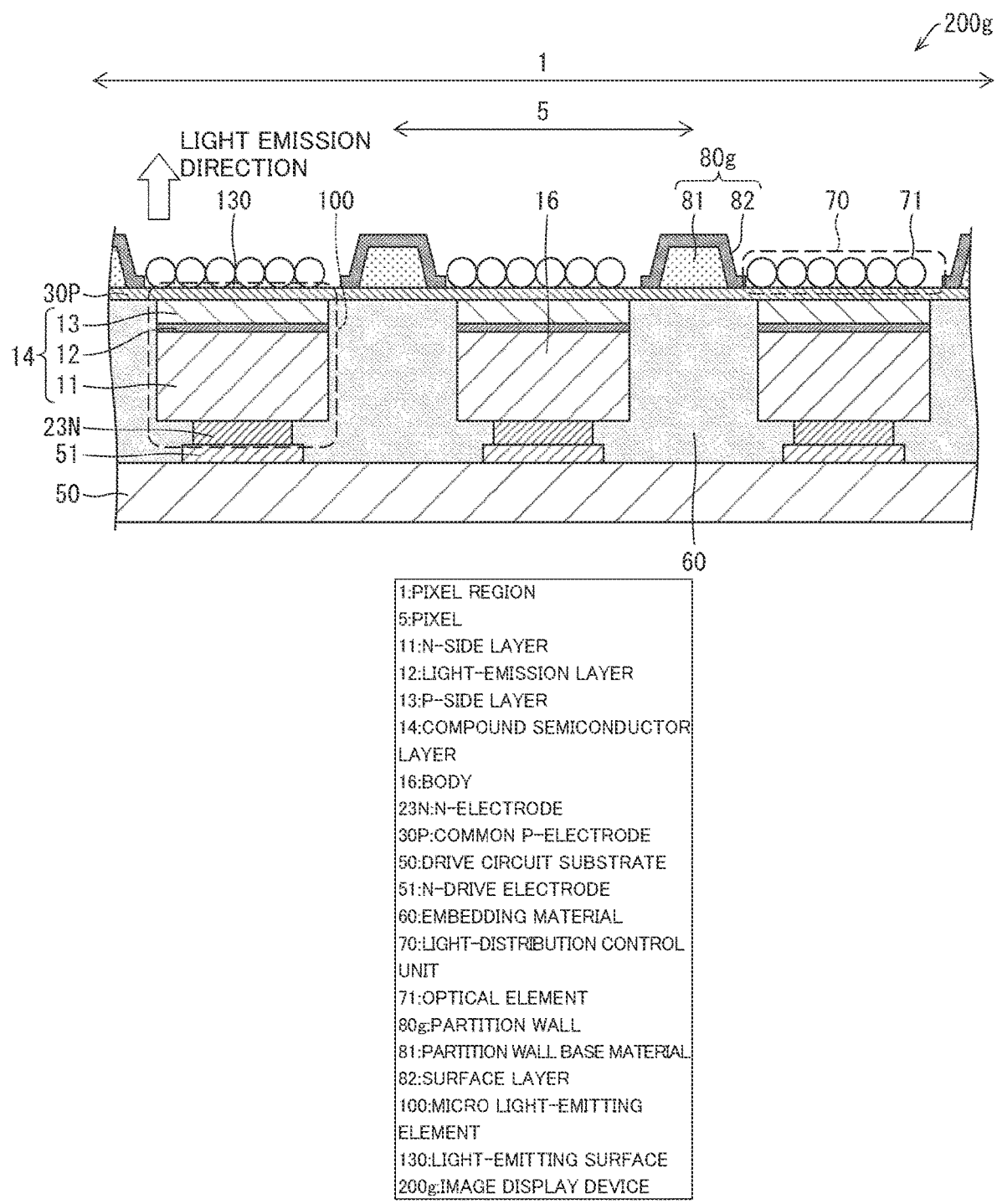
FIG. 10 is a schematic sectional view of a pixel region of an image display device according to a modified example of Embodiment 1 of the disclosure.

An image display device 200g illustrated in FIG. 10 has a partition wall 80g that has a different configuration. That is, although the partition wall 80 is constituted by a single metal film in Embodiment 1, the configuration in FIG. 10 is such that a surface layer 82 is provided on a side wall of a partition wall base material 81. The partition wall base material 81 may be an inorganic material such as $SiO_2$ or SiN or may be a resin. The partition wall 80g may include any material inside thereof as long as the partition wall 80 has a surface covered with a material that does not transmit light. A side surface of the partition wall 80g desirably has high reflectance, and the surface layer 82 is desirably a metal thin film having high reflectance, such as silver or aluminum. Regarding the material of the partition wall, the side wall is notable and is desirably made from metal that reflects light emitted by the micro light-emitting element 100. A light-absorbing body may be disposed on the upper surface of the partition wall when it is permitted that the structure becomes complex.

The shape and disposition pattern of the optical element constituting the light-distribution control unit may have various configurations. Notable points are the shape in sectional view of the optical element having a surface inclined relative to the light-emitting surface 130 and the refractive index of the transparent body constituting the optical element. Regarding the refractive index of the optical element, a material is desired to be selected as appropriate in accordance with a material that emits light.

Embodiment 2

Another embodiment of the disclosure will be described below with reference to FIG. 11. An image display device 200h of Embodiment 2 is a monochromatic display device, and each of the pixels 5 includes one monochromatic micro light-emitting element 100h. Although a red display device will be described as the image display device 200h here, the same is applicable to display devices of other colors. Further, although description will be given by assuming that blue light is used as excitation light, bluish purple light (wavelength of 400 nm to 430 nm) or ultraviolet light (wavelength of less than 400 nm) may be used.

The micro light-emitting element 100h includes an excitation-light-emitting element 105 that emits blue light, and a red wavelength conversion unit 32. A light-emitting surface 130h of the micro light-emitting element 100h is the upper surface of the red wavelength conversion unit 32.

Similarly to Embodiment 1, the periphery of the micro light-emitting element 100h is covered with an embedding material 60h having a light-insulating property. That is, the peripheries of the excitation-light-emitting element 105 and the red wavelength conversion unit 32 are also covered with the embedding material 60h. Thus, optical crosstalk between micro light-emitting elements 100h is able to be suppressed.

The excitation-light-emitting element 105 includes a body 16h formed by a nitride semiconductor layer 14h, protection film 17, a P-electrode 23P (second electrode), and the N-electrode 23N (first electrode). The nitride semiconductor layer 14h includes the light-emission layer 12 that emits light, the N-side layer 11 (first conductive layer) that injects electrons to the light-emission layer 12, and the P-side layer 13 (second conductive layer) that injects holes to the light-emission layer 12. Both the P-electrode 23P and the N-electrode 23N of the excitation-light-emitting element 105 are formed on the second surface. The protection film is made of an insulating film to protect the body 16h. The P-electrode 23P and the N-electrode 23N are connected to the corresponding P-drive electrode 52 and the corresponding N-drive electrode 51 of the drive circuit substrate 50h, respectively. A current supplied from the drive circuit substrate 50*h* to the excitation-light-emitting element 105 is transmitted from the P-drive electrode 52 to the P-side layer 13 via the P-electrode 23P. The current that has passed from the P-side layer 13 to the light-emission layer 12 flows from the N-side layer 11 to the N-drive electrode 51 via the N-electrode 23N. In this manner, the excitation-light-emitting element 105 emits light with given intensity in accordance with the amount of the current supplied from the drive circuit substrate 50*h*, and the red wavelength conversion unit 32 absorbs excitation light and emits red light in accordance with the amount of the excitation light.

Figure 11:
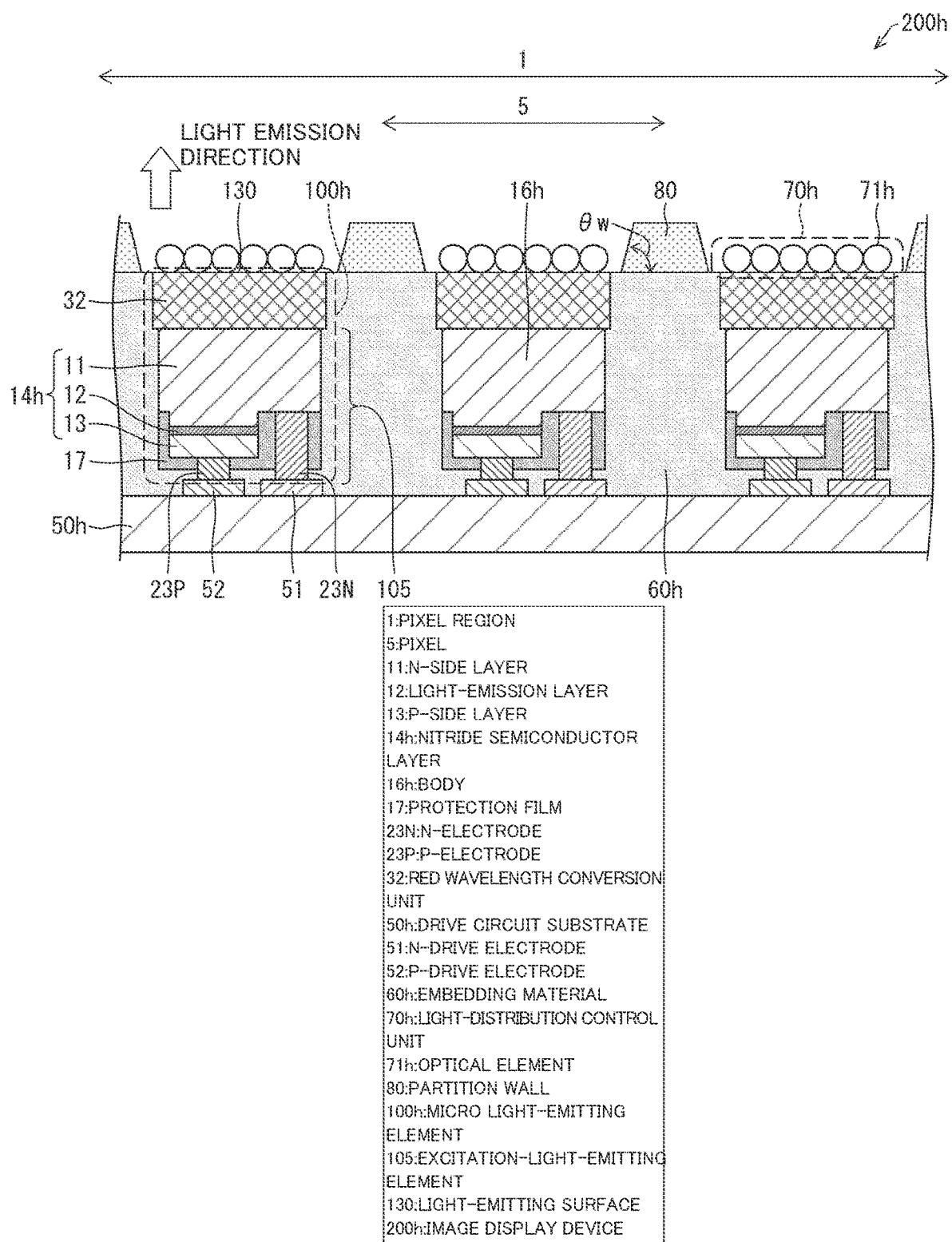
FIG. 11 is a schematic sectional view of a pixel region of an image display device according to Embodiment 2 of the disclosure.

Note that, although a side wall of the body 16*h* of the excitation-light-emitting element 105 is illustrated so as to be vertical to a horizontal plane in the configuration of FIG. 11, the periphery of the light-emission layer 12 or a side wall of the N-side layer 11 may be inclined. For example, the periphery of the light-emission layer 12 is inclined in a range of 35 degrees to 60 degrees, and a side surface of the N-side layer 11 is inclined in a range of about 85 degrees to 70 degrees. By inclining the side surface, it is possible to increase the amount of excitation light entering the red wavelength conversion unit 32 and improve light emission efficiency. Additionally, by inclining a side wall of the red wavelength conversion unit 32, it is possible to improve efficiency of emitting red light to the outside. By covering each of the inclined surfaces with a transparent insulation film and covering the outside thereof with a high-reflectance metal film such as aluminum or silver, it is possible to further improve light extraction efficiency.

The red wavelength conversion unit 32 is generally a resin that contains phosphors or quantum dots, which absorb excitation light and down-convert the excitation light. When being constituted by a quantum dot and a base resin, the red wavelength conversion unit 32 may include a scattering body that scatters excitation light. The scattering body is a particle that is made from a transparent body having a refractive index different from that of the base resin and that is several tens of nanometers to several hundreds of nanometers in size. When an optical path length of excitation light in the red wavelength conversion unit 32 increases, the amount of excitation light that is absorbed increases. Thereby, it is possible to enhance efficiency of converting excitation light to red light.

A light-distribution control unit 70*h* and the partition wall 80 are similar to those of Embodiment 1 illustrated in FIG. 1. A difference from FIG. 1 is that, when a light emission wavelength is converted to red light and a refractive index n of the light-emitting surface 130 changes, the optical element arrangement pitch in the light-distribution control unit 70*h* and the size and refractive index of the optical element 71*h* change. Microbeads of 500 nm in average diameter are densely disposed on the surface of the red wavelength conversion unit 32 that contains quantum dots. The microbeads have the refractive index of 1.43 and are made of glass. The light emission intensity measured from all beams of light increases by 15%. On the other hand, the intensity of forward emission at θ≤30 degrees increases by 9%.

Note that, although the surface of the red wavelength conversion unit 32 is illustrated as a flat surface in FIG. 11, the red wavelength conversion unit 32 has a slight depression because it is formed with a resin layer applied. In this manner, even when the light-emitting surface 130 is not a completely flat surface, the effect of the light-distribution control unit 70*h* is effective. The present embodiment is also able to achieve an effect similar to that of Embodiment 1.

Embodiment 3

Another embodiment of the disclosure will be described below with reference to FIG. 12. Similarly to Embodiment 2, an image display device 200*i* of Embodiment 3 is a monochromatic display device including a wavelength conversion unit but is different from that of Embodiment 2 in terms of having a dielectric multilayer film 74 provided on the surface of the wavelength conversion unit. In the present configuration, the surface of the dielectric multilayer film 74 is the light-emitting surface 130.

Although the red wavelength conversion unit 32 will be described, the same is applicable to the wavelength conversion units of other wavelengths. The dielectric multilayer film 74 has characteristics of reflecting excitation light and transmits red light. Thereby, even when the red wavelength conversion unit 32 is thin, it is possible to reduce leakage of excitation light and increase intensity of red light.

Figure 12:
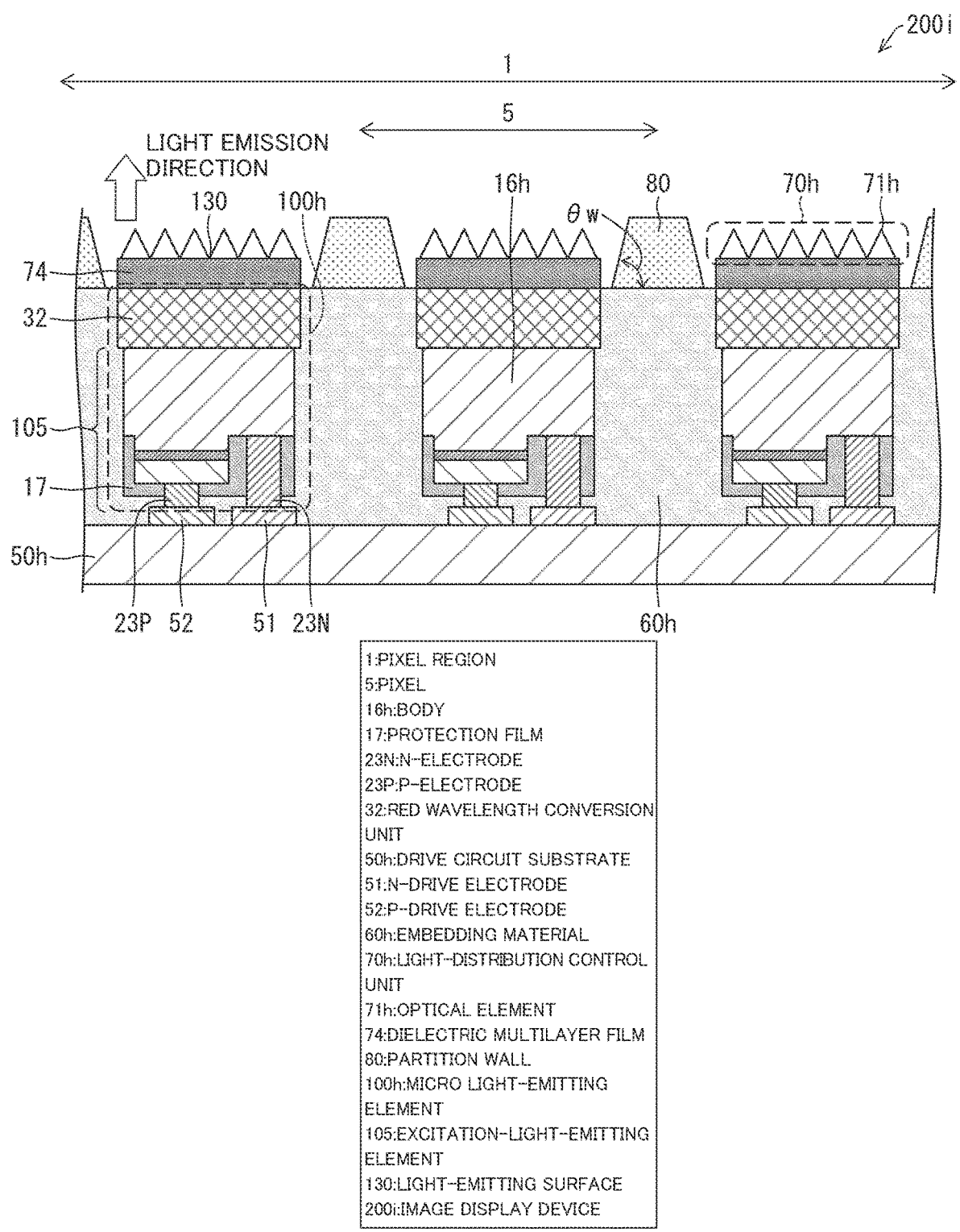
FIG. 12 is a schematic sectional view of a pixel region of an image display device according to Embodiment 3 of the disclosure.

Note that, the dielectric multilayer film 74 is divided for each of the pixels in FIG. 12. When the dielectric multilayer film 74 is continuous between pixels, optical crosstalk may be caused through the dielectric multilayer film 74. For suppressing such optical crosstalk, it is desirable that the dielectric multilayer film 74 is also provided in the interior of partition wall 80. However, when there is no problem in optical crosstalk caused by the dielectric multilayer film 74, the dielectric multilayer film 74 may be provided so as to be continuous between pixels. The continuous dielectric multilayer film 74 is able to be formed by a more simplified process. The present embodiment is also able to achieve an effect similar to that of Embodiment 1.

Embodiment 4

Figure 13:
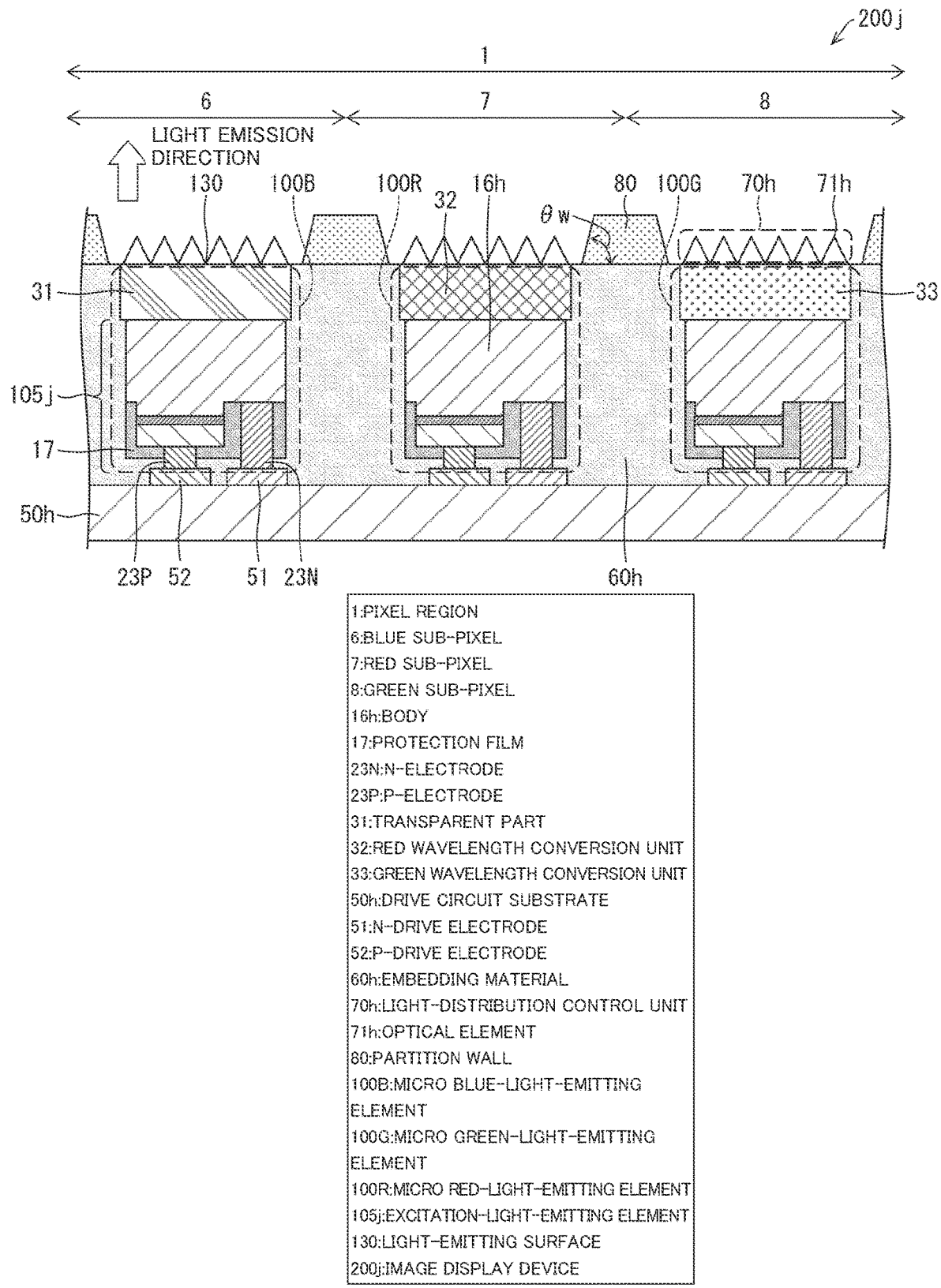
FIG. 13 is a schematic sectional view of a pixel region of an image display device according to Embodiment 4 of the disclosure.

Another embodiment of the disclosure will be described below with reference to FIG. 13. An image display device 200*j* of the present configuration is a full-color display device of three primary colors of RGB, and the pixels 5 include a blue sub-pixel 6, a red sub-pixel 7, and a green sub-pixel 8. The blue sub-pixel 6 includes one micro blue-light-emitting element 100B, the red sub-pixel 7 includes one micro red-light-emitting element 100R, and the green sub-pixel 8 includes two micro green-light-emitting elements 100G.

The micro red-light-emitting element 100R includes an excitation-light-emitting element 105*j* that emits blue light, and the red wavelength conversion unit 32. Similarly, the micro green-light-emitting element 100G includes the excitation-light-emitting element 105*j* and a green wavelength conversion unit 33. The micro blue-light-emitting element 100B includes the excitation-light-emitting element 105*j* and a transparent part 31. The excitation-light-emitting element 105*j* is similar to that of the micro light-emitting element 100 of Embodiment 1. Note that, in the present configuration, a wavelength conversion unit that uses blue light as excitation light and performs down-conversion of a wavelength to red light or green light is provided, and the blue light is used as excitation light as it is. Note that it is also possible to generate blue light by performing down-conversion by using near-ultraviolet light or ultraviolet light as excitation light. Note that, in the following description, when there is no particular necessity to distinguish between the transparent part 31, the red wavelength conversion unit 32, and the green wavelength conversion unit 33, they are simply described as wavelength conversion units in some cases.

The transparent part 31, the red wavelength conversion unit 32, and the green wavelength conversion unit 33 may each include a scattering body. The scattering body of each of the red wavelength conversion unit 32 and the green wavelength conversion unit 33 improves conversion efficiency by enhancing efficiency of absorbing excitation light. The scattering body enables the transparent part 31 to improve efficiency of emitting blue light by reducing a light confining effect.

In the present configuration, the surfaces of the red wavelength conversion unit 32, the green wavelength conversion unit 33, and the transparent part 31 are light-emitting surfaces 130. In FIG. 13, the light-distribution control unit 70$h$ of Embodiment 2 is disposed on each of the surfaces of the red wavelength conversion unit 32, the green wavelength conversion unit 33, and the transparent part 31, and the partition wall 80 is formed between sub-pixels. The size and shape of the optical element 71$h$ constituting the light-distribution control unit 70$h$ may be changed for each of the sub-pixels. Alternatively, different light-distribution control units may be provided for each of the sub-pixels. The present embodiment is also able to achieve an effect similar to that of Embodiment 1.

Embodiment 5

Figure 14:
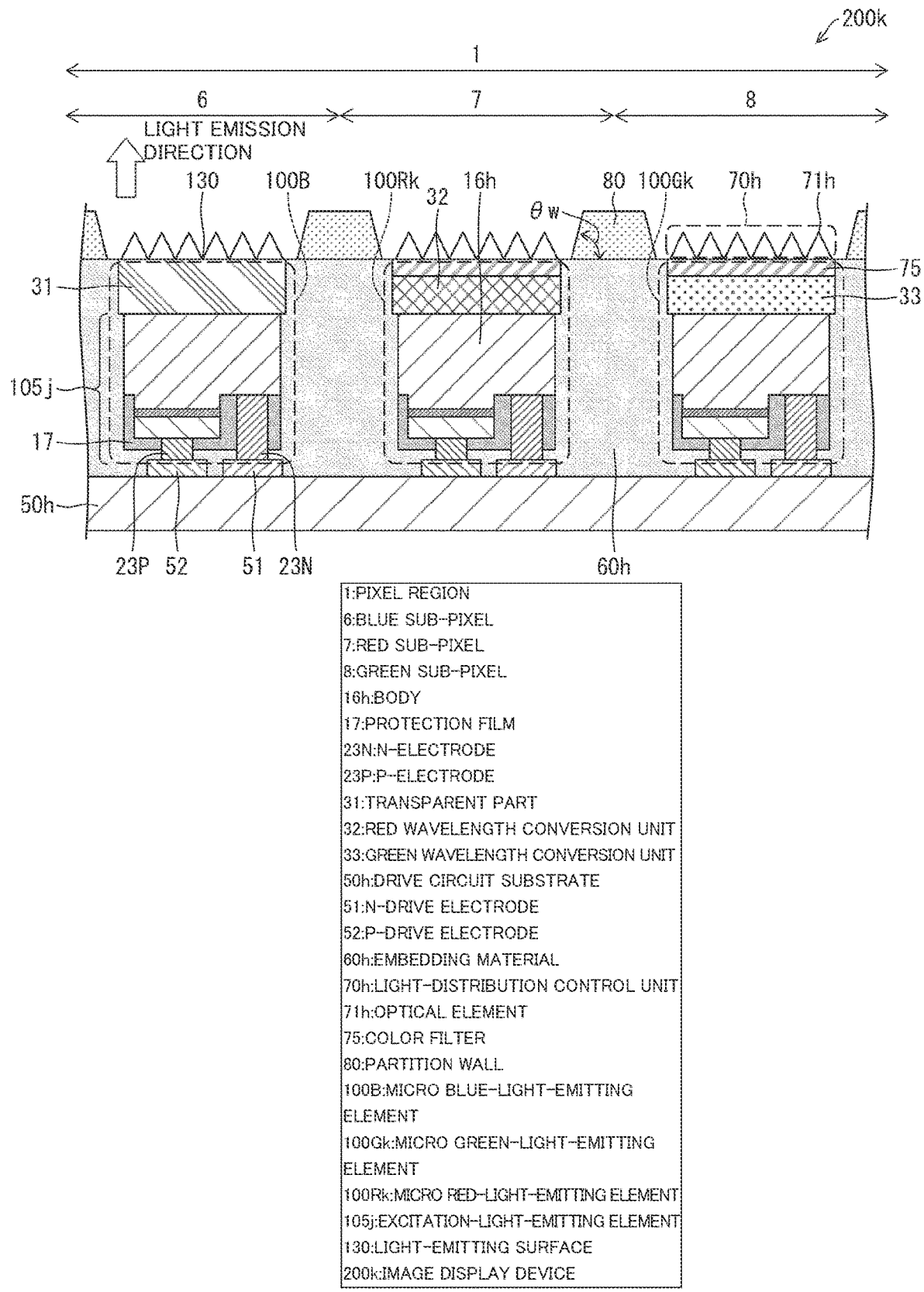
FIG. 14 is a schematic sectional view of a pixel region of an image display device according to Embodiment 5 of the disclosure.

Another embodiment of the disclosure will be described below with reference to FIG. 14. An image display device 200$k$ of the present configuration provides a full-color display device similar to that of Embodiment 4 and is different from that of Embodiment 4 in that a color filter 75 is disposed on a wavelength conversion unit.

When blue light is converted to red light or green light by using the wavelength conversion unit, it is difficult to completely suppress leakage of blue light that is excitation light. In particular, when it is desired to reduce a thickness of the wavelength conversion unit due to miniaturization of pixels, leakage of excitation light may be caused. By disposing a color filter which absorbs excitation light and transmits red light or green light, leakage of excitation light is able to be suppressed. As illustrated in FIG. 14, the color filter 75 is disposed on the red wavelength conversion unit 32, and the light-distribution control unit 70$h$ is disposed on the surface of the color filter. The same is applied to the green wavelength conversion unit. In this case, the light-emitting surfaces of the micro red-light-emitting element 100R$k$ and the micro green-light-emitting element 100G$k$ are surfaces of color filters. The color filter 75 may include a scattering body that scatters excitation light. Thereby, there is an effect of reducing efficiency of emitting excitation light. The present embodiment is also able to achieve an effect similar to that of Embodiment 1. Further, the present embodiment is also able to achieve a secondary effect that leakage of excitation light is able to be reduced.

Embodiment 6

Figure 15:
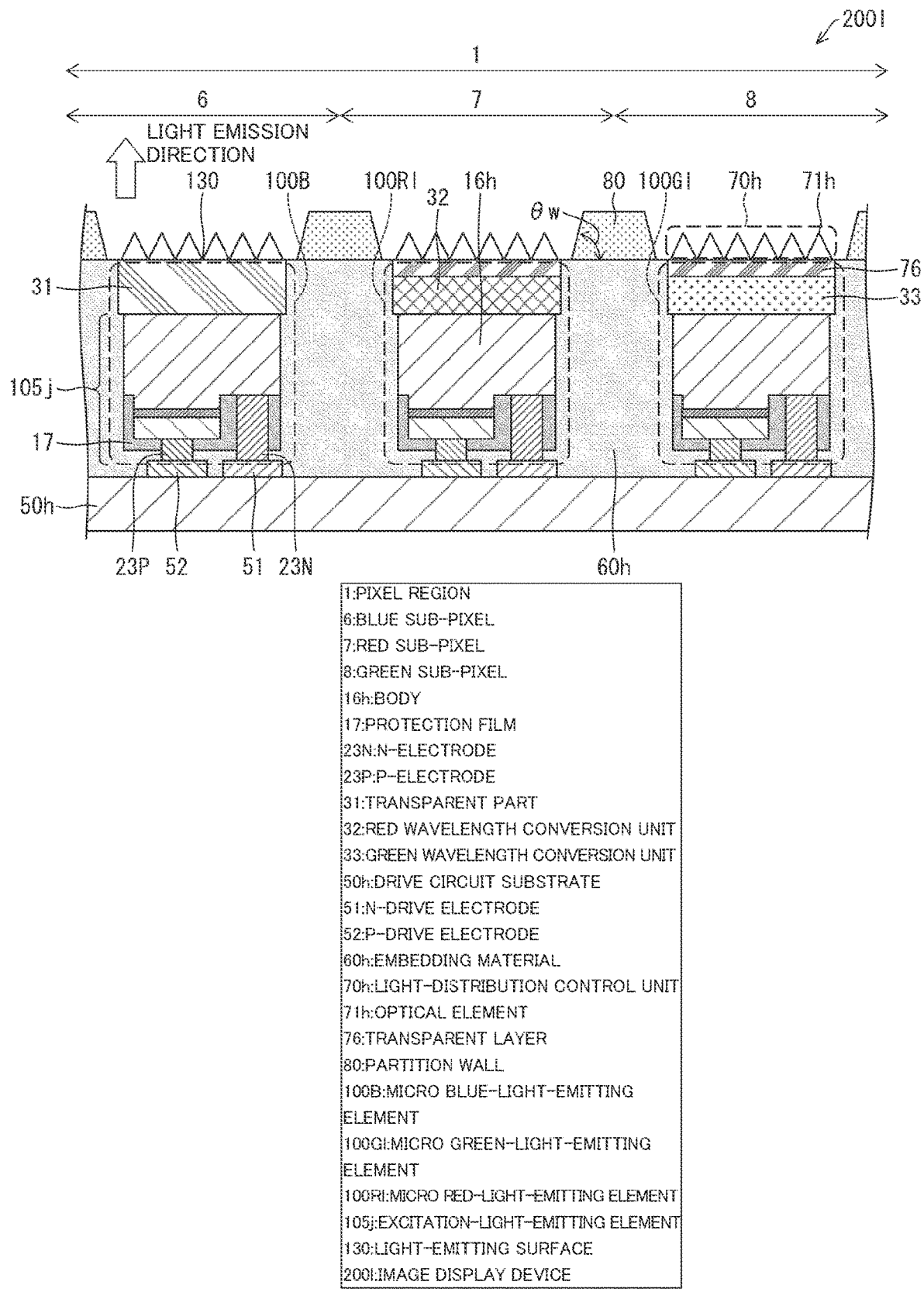
FIG. 15 is a schematic sectional view of a pixel region of an image display device according to Embodiment 6 of the disclosure.

Another embodiment of the disclosure will be described below with reference to FIG. 15. An image display device 200$l$ of the present configuration provides a full-color display device similar to that of Embodiment 4 and is different from that of Embodiment 4 in that a transparent layer 76 is disposed on a wavelength conversion unit.

In the present configuration, even when the red wavelength conversion unit 32 and the green wavelength conversion unit 33 have different thicknesses, it is possible to easily flatten the surface of each of the sub-pixels. For example, after the embedding material 60$h$ is formed, the red wavelength conversion unit 32 and the green wavelength conversion unit 33 are formed, and then, when the transparent part 31 is formed, a transparent resin that has high flowability is applied also to the red sub-pixel 7 and the green sub-pixel 8. As a result, the surfaces are able to be flattened by flowability of the resin. When the surfaces are able to be flattened, the light-distribution control unit 70$h$ and the partition wall 80 are able to be easily formed. The transparent resin may include a scattering body that scatters excitation light. The present embodiment is also able to achieve an effect similar to that of Embodiment 1. Further, the present embodiment is also able to achieve a secondary effect that the light-distribution control unit and the partition wall are easily manufactured.

Embodiment 7

Figure 16:
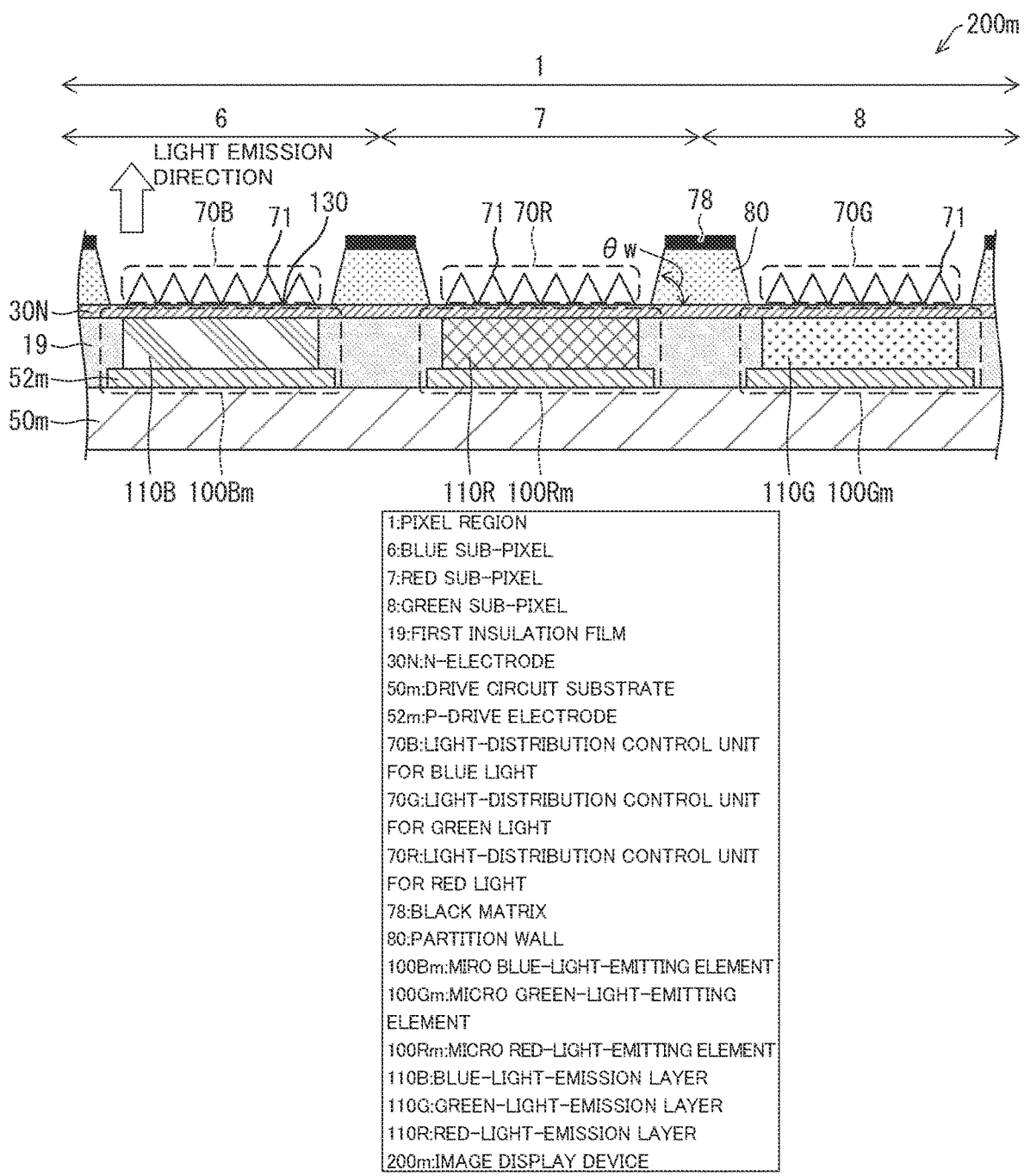
FIG. 16 is a schematic sectional view of a pixel region of an image display device according to Embodiment 7 of the disclosure.
Figure 17:
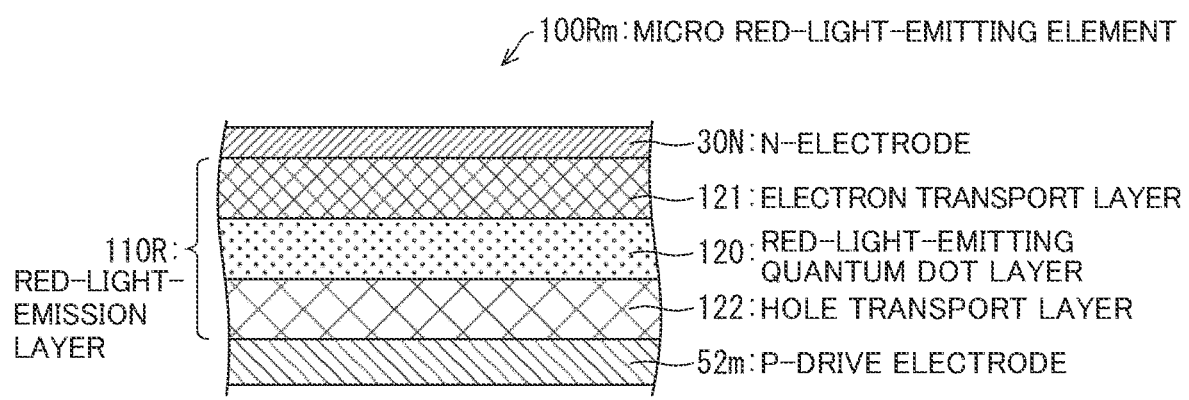
FIG. 17 is a schematic sectional view of a micro red-light-emitting element according to Embodiment 7 of the disclosure.

Another embodiment of the disclosure will be described below with reference to FIGS. 16 and 17. An image display device 200$m$ of the present configuration is a full-color display device similar to that of Embodiment 4 but is different from that of Embodiment 4 in that a QLED is adopted as a micro light-emitting element. In the present configuration, a micro red-light-emitting element 100R$m$ is constituted by a P-drive electrode 52$m$, a red-light-emission layer 110R formed on the P-drive electrode 52$m$, and a common N-electrode 30N formed on the red-light-emission layer 110R. As illustrated in FIG. 17, in the red-light-emission layer 110R, an electron transport layer 121 and a hole transport layer 122 are disposed with a red-light-emitting quantum dot layer 120 therebetween. Electrons and holes are respectively injected from the electron transport layer 121 and the hole transport layer 122 to the red-light-emitting quantum dot layer 120 and recombined in a quantum dot, and thereby light is emitted. By changing a core size of the quantum dot, it is possible to control a light emission wavelength. Thus, a micro blue-light-emitting element 100B$m$ and a micro green-light-emitting element 100G$m$ are able to be formed by a QLED similarly. Note that, in the following description, when there is no necessity to distinguish between colors, the layers are simply described as light-emission layers 110 in some cases. A detailed configuration of the QLED is not directly related to the disclosure and is thus not described.

The common N-electrode 30N is a transparent conductive film. The surface of the P-drive electrode 52$m$ desirably has high reflectance to visible light. The light-emitting surface of the present configuration is the surface of the common N-electrode 30N. The micro red-light-emitting element 100R$m$, the micro blue-light-emitting element 100B$m$, and the micro green-light-emitting element 100G$m$ are insulated from each other by a first insulation film 19. The first insulation film 19 desirably has a light-shielding property. The first insulation film 19 is, for example, a resin material that contains a light-absorbing pigment or dye. Alternatively, the first insulation film 19 is a resin material that contains scattering particles made of titanium oxide or the like. The former resin material has a light absorptive property, and the latter resin material has a reflective property. The first insulation film 19 more desirably has a reflective property.

In the present configuration, the surface of the common N-electrode 30N constituting a micro light-emitting element is the light-emitting surface 130, and the surface of the micro light-emitting element is the light-emitting surface 130. A light-distribution control unit 70R is disposed on the common N-electrode 30N of the micro red-light-emitting element 100Rm. Similarly, a light-distribution control unit 70G is disposed on the common N-electrode 30N of the micro green-light-emitting element 100Gm, and a light-distribution control unit 70B is disposed on the common N-electrode 30N of the micro blue-light-emitting element 100Bm. The light-distribution control units 70B, 70G, and 70R each form an equilateral triangular pattern, a distance between optical elements 71 is 350 nm in the light-distribution control unit 70B for blue light, 400 nm in the light-distribution control unit 70G for green light, and 500 nm in the light-distribution control unit 70R for red light. By using different light-distribution control units for each of the light-emission colors, it is possible to increase the intensities of forward emission of the respective light-distribution control units.

The size of the optical element 71 may be changed in accordance with a wavelength of a light-emission color. When the wavelength becomes short, the optical element 71 may be reduced in size. The same size and disposition pattern of the optical element 71 may be used in all the sub-pixels to simplify a manufacturing process.

In the present configuration, the partition wall 80 is provided between sub-pixels. The partition wall 80 may be electrically connected to the common N-electrode 30N. This makes it possible to reduce wiring resistance of the common N-electrode 30N.

In the present configuration, a black matrix 78 covers the upper surface of the partition wall 80 between sub-pixels. Although the partition wall 80 is used to suppress optical crosstalk, when a large metal pattern is on the light-emitting surface 130, a display image is degraded due to reflection of external light. The black matrix 78 that absorbs external light is desirably disposed to suppress the degradation. The present configuration is also able to achieve an effect similar to that of Embodiment 1 by disposing a light-distribution control unit so as to cover the light-emitting surface 130.

Modified Example

As a modified example of Embodiment 7, for each of the light-emission layers 110B, 110R, and 110G, an organic LED (OLED) is able to be used instead of the QLED. Similarly to the QLED, the OLED is configured such that an organic light-emitting layer is disposed between the electron transport layer 121 and the hole transport layer 122.

Embodiment 8

Another embodiment of the disclosure will be described below with reference to FIG. 18. An image display device 200n of the present configuration uses a QLED as a micro light-emitting element similarly to Embodiment 7 but is different from that of Embodiment 7 in that a surface of the transparent layer 76 disposed on the QLED is used as the light-emitting surface 130 and that a partition wall 80n separates QLEDs. That is, the partition wall 80n separates not only light-distribution control units 70 but also micro light-emitting elements between sub-pixels. A light-emitting material of the QLED or the like generally has a high refractive index and tends to exhibit low light extraction efficiency. Therefore, a transparent resin having a relatively high refractive index is disposed on the QLED to thereby extract light to the transparent resin, and the light is emitted from the transparent resin to the air, thus making it possible to improve light extraction efficiency. The light extraction efficiency of extracting light from the transparent layer 76 to the air is able to be improved when a side wall of the partition wall in contact with the transparent layer 76 is formed of a reflective material and is inclined so as to open in the light emission direction. Note that the transparent layer 76 may be omitted when the light-distribution control unit 70 is able to achieve sufficient light extraction efficiency.

The partition wall 80n separates sub-pixels, and a side wall of the partition wall 80n is inclined so as to open in the light emission direction. The side wall of the partition wall 80n is formed of a high-reflectance material. As illustrated in FIG. 18, the side wall is inclined relative to the light-emitting surface 130 at the inclination angle θw. θw is desirably in a range of 30 degrees to 60 degrees. The QLED emits light isotropically and thus emits light also in the horizontal direction in FIG. 18. When the light travelling in the horizontal direction is reflected upward, leakage of light to an adjacent pixel is able to be suppressed, and light extraction efficiency is able to be improved. Note that, when there is a surplus in light outputs of the micro light-emitting elements 100Rn, 100Bn, and 100Gn, the side wall of the partition wall 80n may have a light absorptive property.

In the present configuration, the transparent layer 76 is also disposed in the interior of the partition wall 80n, and the side wall enables improvement of the efficiency of extracting light from the transparent layer 76 to the air. By disposing the light-distribution control unit 70 on the surface of the transparent layer 76, it is possible to increase light emission in the forward direction. Similarly to other embodiments, the light-distribution control unit 70 disposed on the transparent layer 76 may vary depending on the light-emission color. Moreover, the black matrix 78 may be disposed between sub-pixels.

The common N-electrode 30N may be electrically connected to the partition wall 80n. The electrical connection makes it possible to suppress an increase in resistance of the N-electrode even when the common N-electrode 30N is reduced in thickness. The height of the upper surface of the partition wall 80n is desirably higher than the surface of the light-distribution control unit 70 and is desirably more than or equal to a sum of the thickness of the light-emission layer 110, the thickness of the transparent layer 76, and the thickness of the light-distribution control unit 70.

Figure 18:
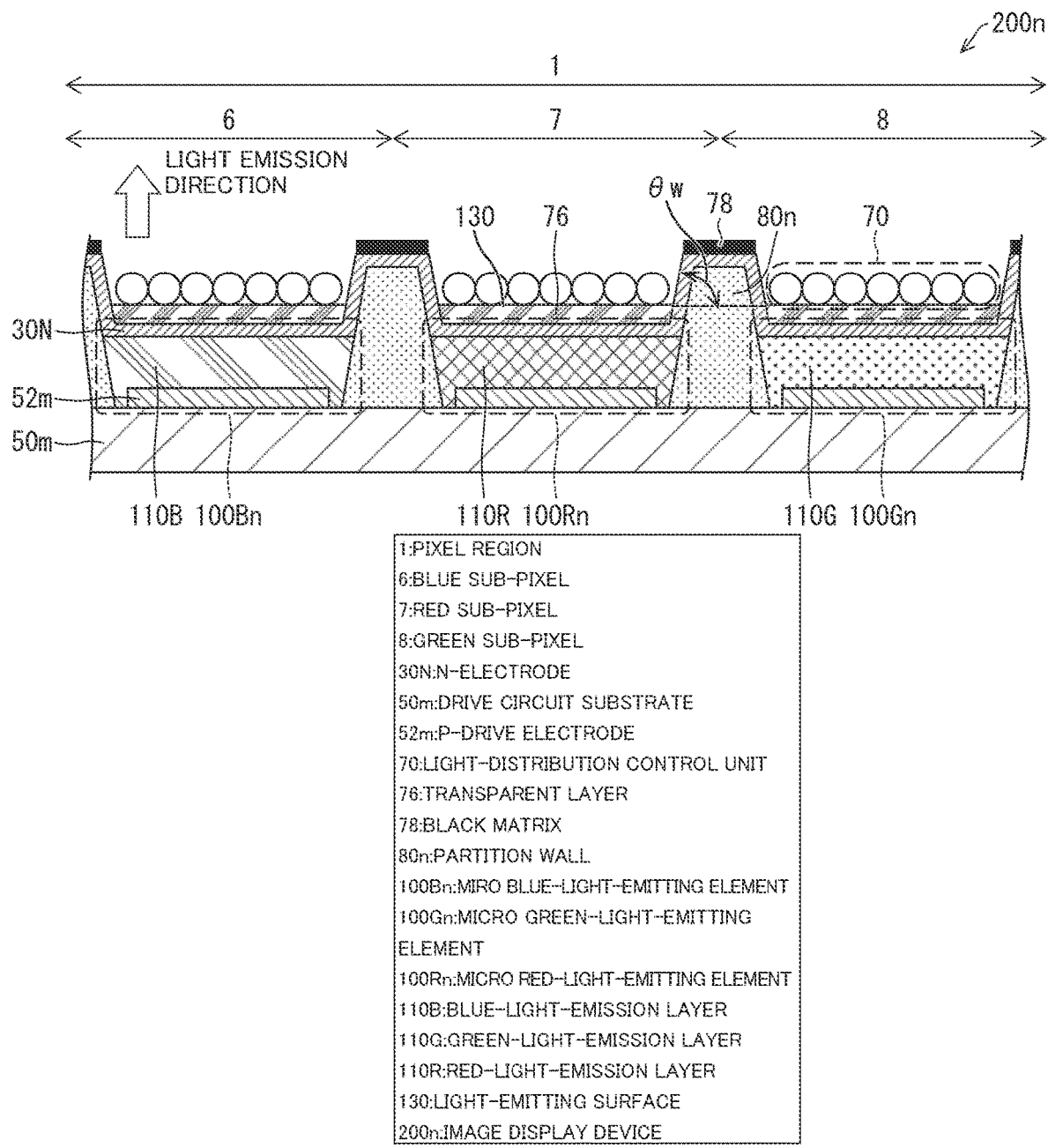
FIG. 18 is a schematic sectional view of a pixel region of an image display device according to Embodiment 8 of the disclosure.

Although the light-emission layer 110 is in contact with the partition wall 80n in FIG. 18, it is not desirable that the P-drive electrode 52m and the partition wall 80n are short-circuited. Thus, for example, the hole transport layer 122 may be disposed only on the P-drive electrode 52m. The present configuration is also able to achieve an effect similar to that of Embodiment 1 by disposing the light-distribution control unit on the light-emitting surface.

Embodiment 9

Figure 19:
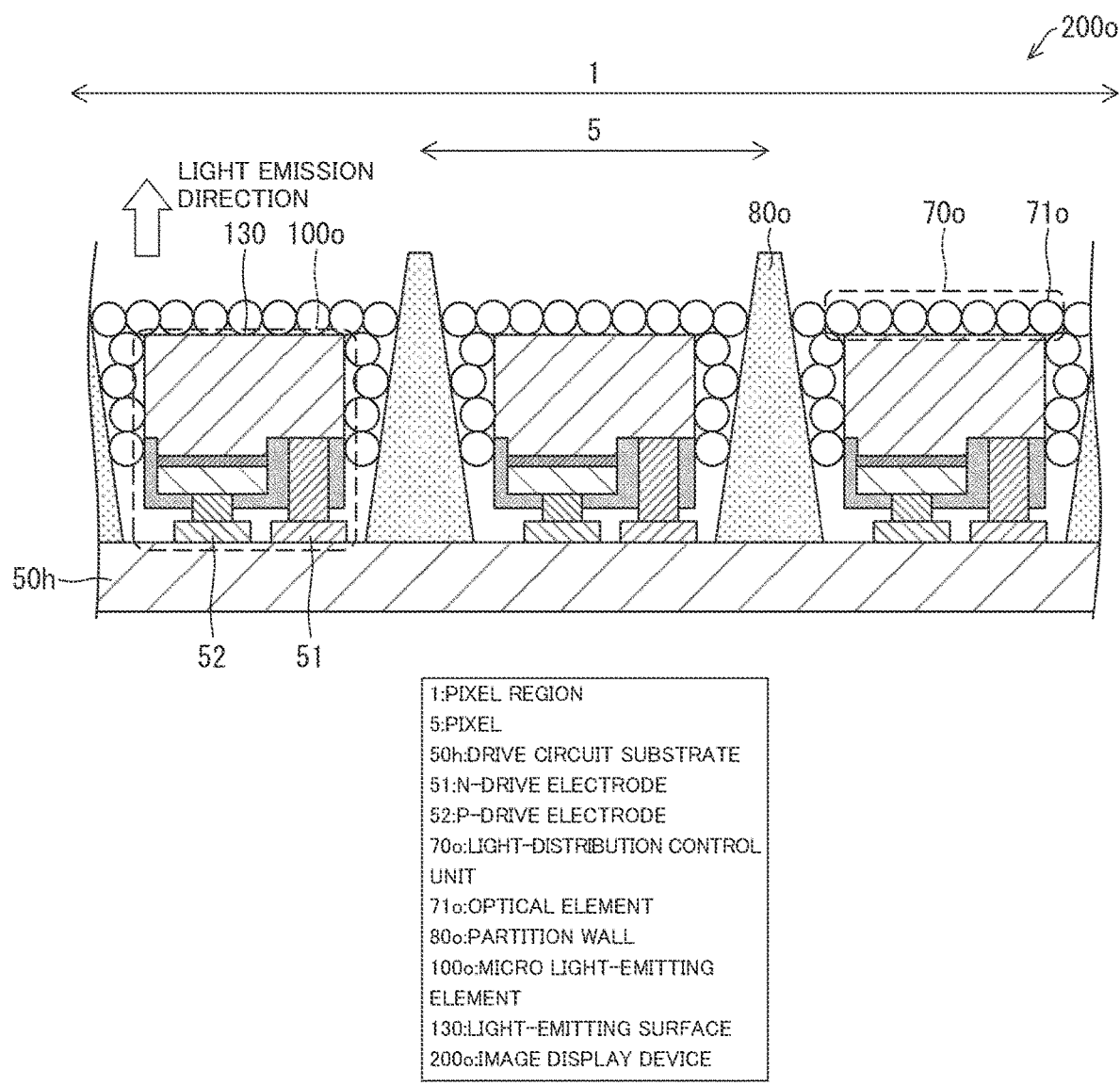
FIG. 19 is a schematic sectional view of a pixel region of an image display device according to Embodiment 9 of the disclosure.

Another embodiment of the disclosure will be described below with reference to FIG. 19. The present embodiment is characterized in that a partition wall 80o is used to separate micro light-emitting elements. In Embodiment 1, the micro light-emitting elements 100 are isolated from each other by the embedding material 60, and the partition wall 80 is provided on the embedding material 60. In the present embodiment, the partition wall 80o separates micro light-emitting elements 100o and separates light-distribution control units 70o.

An image display device 200*o* of Embodiment 9 is intended to achieve an image display device having a pixel larger than that of Embodiment 1. In Embodiment 1, the micro light-emitting element 100 is covered with the embedding material 60, and the partition wall 80 is provided thereon. Meanwhile, in the present embodiment, the partition wall 80*o* is directly provided on the drive circuit substrate 50 without using the embedding material 60. That is, the partition wall 80*o* separates not only light-distribution control units 70*o* but also micro light-emitting elements 100. Such a form is able to be adopted when a pixel pitch is wide and a space between micro light-emitting elements 100*o* is able to be increased. Such a partition wall 80*o* is not limited to being made of metal and may be a reflective resin material made of a resin containing a white pigment or may be an absorptive resin material containing a black dye or pigment. That is, it is desirable that the partition wall 80*o* does not transmit light emitted by the micro light-emitting element.

In the present embodiment, after the micro light-emitting element 100*o* is arranged, the partition wall 80*o* is formed, and microbeads that are optical elements 71*o* are caused to flow to the interior of the partition wall 80*o*, and thereby, the microbeads are arranged on the light-emitting surface 130. When there is a space between a side wall of the micro light-emitting element 100*o* and the partition all 80*o*, the microbeads also remain between the side wall of the micro light-emitting element 100*o* and the partition wall 80*o*. It is also possible that the space between the side wall of the micro light-emitting element 100*o* and the partition wall 80*o* is filled with a transparent resin or the like such that no microbead remains between the side wall of the micro light-emitting element 100*o* and the partition wall 80*o*.

Since the height of the partition wall 80*o* also increases, the partition wall 80*o* formed by molding using a die in advance is able to be bonded to the drive circuit substrate 50*h*. The present embodiment is also able to achieve an effect similar to that of Embodiment 1.

Embodiment 10

Figure 20:
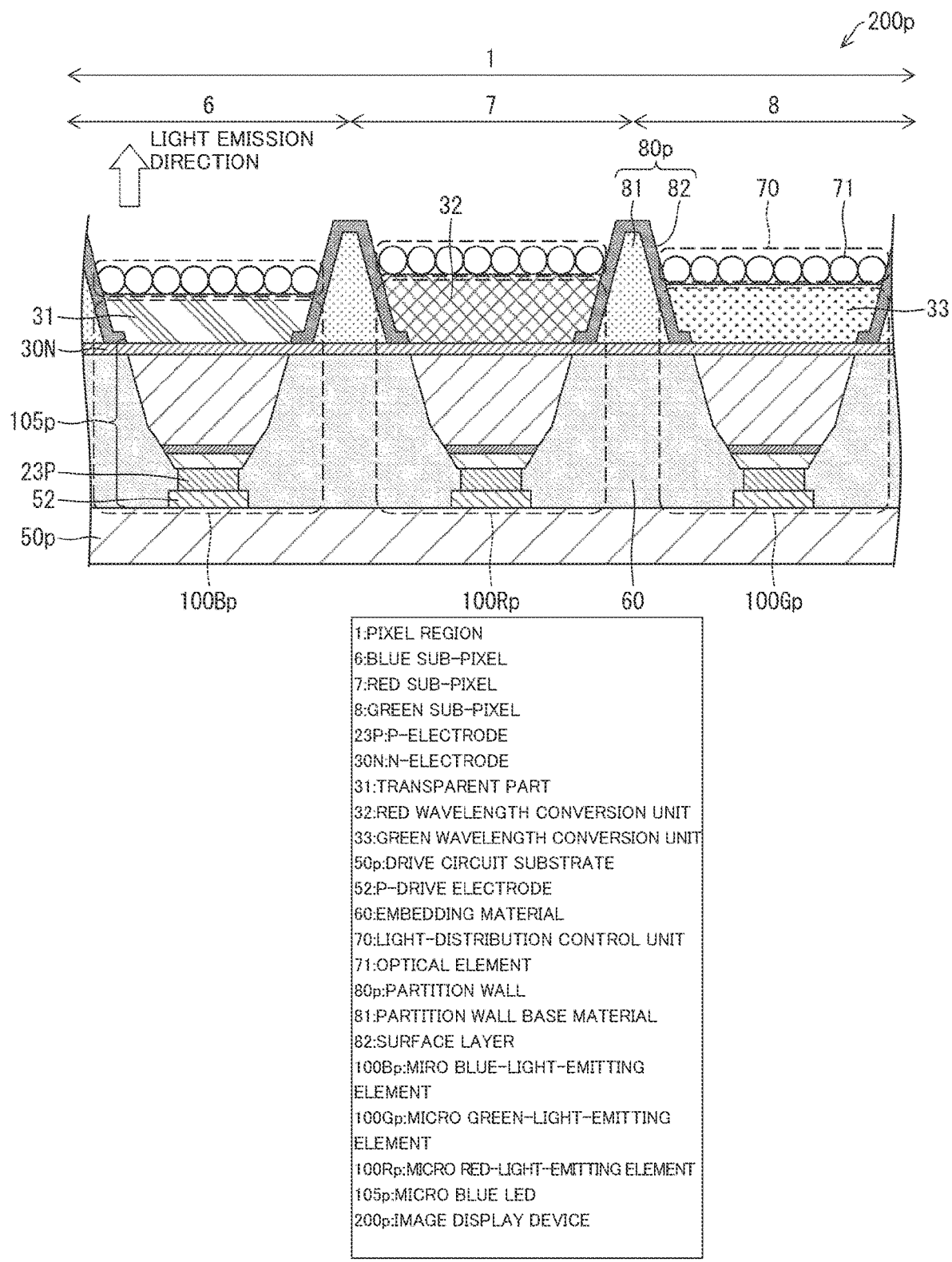
FIG. 20 is a schematic sectional view of a pixel region of an image display device according to Embodiment 10 of the disclosure.

Another embodiment of the disclosure will be described below with reference to FIG. 20. An image display device 200*p* of the present configuration is a full-color display device similar to that of Embodiment 4 and is different from that of Embodiment 4 in that a wavelength conversion unit is disposed in the interior of a partition wall 80*p* to dispose the light-distribution control unit 70 on the wavelength conversion unit. That is, the partition wall 80*p* separates not only light-distribution control units 70 but also wavelength conversion units between sub-pixels.

To suppress optical crosstalk between sub-pixels, the periphery of the wavelength conversion unit is desired to be covered with a wall that has a light-shielding property. Although the wavelength conversion unit is covered with the embedding material 60*h* in Embodiment 4, the wavelength conversion unit is covered with the partition wall 80*p* in the present embodiment. Thus, by disposing the wavelength conversion unit and the light-distribution control unit in the interior of the partition wall 80*p*, both optical crosstalk caused between light-distribution control units 70 and optical crosstalk caused between wavelength conversion units are suppressed.

A structure in which a micro blue LED 105*p* serving as an excitation light source is disposed on a drive circuit substrate 50*p* is similar to that of Embodiment 1 other than that the polarity is reversed. The partition wall 80*p* is disposed on the common N-electrode 30N, and the transparent part 31, the red wavelength conversion unit 32, and the green wavelength conversion unit 33 are respectively formed in the blue sub-pixel 6, the red sub-pixel 7, and the green sub-pixel 8 in the interior of the partition wall 80*p*. The light-distribution control unit 70 is disposed on each of the surfaces of the transparent part 31, the red wavelength conversion unit 32, and the green wavelength conversion unit 33. The top of the partition wall 80*p* is desirably higher than the upper surface of the light-distribution control unit 70.

Although the structure indicated in Modified example of Embodiment 1 described with reference to FIG. 10, in which the partition wall 80 is constituted by the partition wall base material 81 and the surface layer 82, is used as the structure of the partition wall 80*p*, the configuration of the partition wall 80*p* may be a structure of a single layer or a more complex structure. The present embodiment is also able to achieve an effect similar to that of Embodiment 1.

ADDITIONAL MATTER

The disclosure is not limited to each of the embodiments described above and may be modified in various manners within the scope indicated in the Claims, and an embodiment achieved by appropriately combining techniques disclosed in different embodiments is also encompassed in the technical scope of the disclosure. Further, by combining the techniques disclosed in each of the embodiments, a new technical feature may be formed.

The present disclosure contains subject matter related to that disclosed in Japanese Priority Patent Application JP 2020-041391 filed in the Japan Patent Office on Mar. 10, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising:
   micro light-emitting elements;
   a drive circuit substrate including a drive circuit that supplies currents to the micro light-emitting elements to emit light, wherein the micro light-emitting elements are arranged in an array shape on the drive circuit substrate;
   light-distribution control units that increase forward light emission of the micro light-emitting elements, each of the light-distribution control units being disposed on a light-emitting surface of a corresponding one of the micro light-emitting elements; and
   a partition wall, disposed around the light-distribution control units, that does not transmit the light emitted by the micro light-emitting elements, wherein the partition wall forms a portion of a wire that supplies the currents to the micro light-emitting elements.

2. The image display device according to claim 1, wherein a height of an upper surface of the partition wall is higher than or equal to a height of an upper surface of each of the light-distribution control units.

3. The image display device according to claim 1, wherein a side surface of the partition wall reflects the light.

4. The image display device according to claim 1, wherein a side surface of the partition wall, which faces at least one of the light-distribution control units, is inclined so as to open in a light emission direction.

5. The image display device according to claim 1, wherein metal that reflects the light emitted by the micro light-emitting elements is disposed on a side surface of the partition wall, which faces the light-distribution control units.

6. The image display device according to claim 1, wherein the partition wall separates those of the micro light-emitting elements that are adjacent to each other.

7. The image display device according to claim 1, wherein each of the micro light-emitting elements includes a scattering body.

8. The image display device according to claim 1, wherein a black matrix is disposed on an upper surface of the partition wall.

9. The image display device according to claim 1, wherein the micro light-emitting elements comprise:
- a first micro light-emitting element that emits light of a first light emission wavelength; and
- a second micro light-emitting element that emits light of a second light emission wavelength longer than the first light emission wavelength, wherein
- the light-distribution control unit formed on the light-emitting surface of the first micro light-emitting element has a configuration identical to a configuration of the light-distribution control unit formed on the light-emitting surface of the second micro light-emitting element.

10. The image display device according to claim 1, wherein each of the micro light-emitting elements includes an excitation-light-emitting element and a wavelength conversion unit that down-converts excitation light emitted by the excitation-light-emitting element and that emits the down-converted light as the light.

11. The image display device according to claim 10, wherein the partition wall separates the wavelength conversion unit of each of the micro light-emitting elements from the wavelength conversion unit of others of the micro light-emitting elements.

12. The image display device according to claim 10, wherein the wavelength conversion unit has, on a light-emitting surface side, a color filter that absorbs the excitation light and transmits the down-converted light.

13. The image display device according to claim 10, wherein the wavelength conversion unit has, on a light-emitting surface side, a transparent layer that transmits the down-converted light.

14. The image display device according to claim 10, wherein the wavelength conversion unit has, on a light-emitting surface side, a dielectric multilayer film that reflects the excitation light and transmits the down-converted light.

15. The image display device according to claim 1, wherein each of the light-distribution control units includes optical elements that are arrayed, and each of the optical elements is transparent to the emitted light and has a side surface inclined relative to the light-emitting surface.

16. The image display device according to claim 15, wherein a refractive index of each of the optical elements is more than or equal to a geometric mean of a refractive index of a light-emitting part of each of the micro light-emitting elements and a refractive index of outside medium.

17. The image display device according to claim 15, wherein each of the optical elements of a corresponding one of the micro light-emitting elements is disposed to be in contact with at least one other of the optical elements of the corresponding one of the micro light-emitting elements.

18. An image display device comprising:
- micro light-emitting elements;
- a drive circuit substrate including a drive circuit that supplies currents to the micro light-emitting elements to emit light, wherein the micro light-emitting elements are arranged in an array shape on the drive circuit substrate;
- a plurality of optical elements arranged on a light-emitting surface of each of the micro light-emitting elements; and
- a partition wall, disposed around the plurality of optical elements of each of the micro light-emitting elements, that does not transmit light emitted by the micro light-emitting elements, wherein the partition wall forms a portion of a wire that supplies the currents to the micro light-emitting elements.

19. The image display device according to claim 18, wherein each of the optical elements has a side surface inclined relative to the light-emitting surface.

* * * * *